(12) United States Patent
Sanada et al.

(10) Patent No.: US 8,552,492 B2
(45) Date of Patent: Oct. 8, 2013

(54) SEMICONDUCTOR DEVICE

(75) Inventors: Kazuhiko Sanada, Kanagawa (JP);
Hiroshi Kawaguchi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 38 days.

(21) Appl. No.: 12/887,912

(22) Filed: Sep. 22, 2010

(65) Prior Publication Data

US 2011/0068394 A1  Mar. 24, 2011

(30) Foreign Application Priority Data

Sep. 24, 2009  (JP) .................................. 2009-219639

(51) Int. Cl.
| | |
|---|---|
| H01L 29/76 | (2006.01) |
| H01L 29/94 | (2006.01) |
| H01L 31/062 | (2012.01) |
| H01L 31/113 | (2006.01) |
| H01L 31/119 | (2006.01) |

(52) U.S. Cl.
USPC .................... 257/330; 257/332; 257/E27.091

(58) Field of Classification Search
USPC ........................... 257/330, 331, 332, E27.091
See application file for complete search history.

(56) References Cited

U.S. PATENT DOCUMENTS

| | | | |
|---|---|---|---|
| 5,801,075 A * | 9/1998 | Gardner et al. ............... 438/197 |
| 6,093,947 A * | 7/2000 | Hanafi et al. .................. 257/330 |
| 6,118,149 A | 9/2000 | Nakagawa et al. | |
| 6,452,231 B1 | 9/2002 | Nakagawa et al. | |
| 6,919,601 B2 | 7/2005 | Inaba | |
| 7,391,068 B2 | 6/2008 | Kito et al. | |
| 2005/0051843 A1 | 3/2005 | Inaba | |
| 2006/0289905 A1 | 12/2006 | Kito et al. | |
| 2008/0185639 A1 | 8/2008 | Risaki et al. | |
| 2009/0026538 A1 | 1/2009 | Hashitani | |

FOREIGN PATENT DOCUMENTS

| | | |
|---|---|---|
| JP | 52-147269 | 12/1977 |
| JP | 11-103058 | 4/1999 |
| JP | 2005-085960 | 3/2005 |
| JP | 2007-005568 | 1/2007 |
| JP | 2008-192985 | 8/2008 |
| JP | 2009-054999 | 3/2009 |

* cited by examiner

*Primary Examiner* — Hoai V Pham
(74) *Attorney, Agent, or Firm* — Young & Thompson

(57) ABSTRACT

A trench gate transistor whose gate changes the depth thereof intermittently in the gate width direction, has a first offset region and a second offset region formed below the source and drain, respectively. The sum of length measurements of the underlying portion of the second offset region measured from the lower corner of the trench in a direction parallel to the substrate and in a direction perpendicular to the substrate is 0.1 μm or greater.

19 Claims, 19 Drawing Sheets

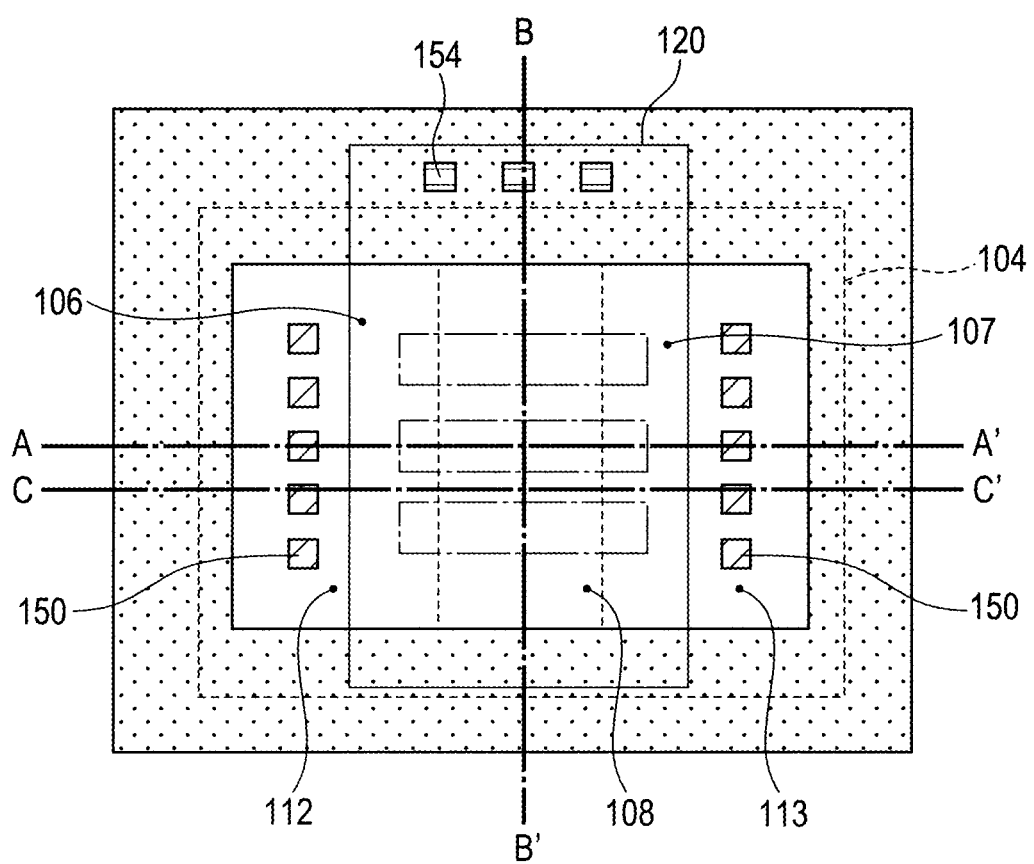

SEMICONDUCTOR DEVICE

CROSS-REFERENCE TO RELATED APPLICATIONS

The disclosure of Japanese Patent Application No. 2009-219639 filed on Sep. 24, 2009 including the specification, drawings and abstract is incorporated herein by reference in its entirety.

BACKGROUND OF THE INVENTION

1. Field of the Invention

The present invention relates to a semiconductor device and a manufacturing method thereof.

2. Description of Related Art

Techniques have been proposed for forming uneven surfaces such as trenches in the channel region of a substrate, to increase the effective channel width of a transistor without increasing in size.

For example, Japanese Patent Laid-Open No. H11-103058 and Japanese Patent Laid-Open No. S51-147269 describe a semiconductor device including a trench gate structure in which trenches are formed on the substrate surface. Japanese Patent Laid-Open No. 2007-5568 describes a semiconductor device in which a plurality of projecting silicon regions are formed in the width direction of a channel region formed between a source region and a drain region which are formed on a semiconductor substrate. A gate insulating film and a gate electrode are formed facing the channel region on the silicon projections. A reduction in the pitch of the gates reduces the width of the projections and achieves full depletion of a depletion layer in the projections during the operation of transistors, thus mitigating the short channel effect and improving the subthreshold slope (Japanese Patent Laid-Open No. 2005-085960). It is also possible to use such a decrease in the substrate bias dependence of threshold voltage due to such full depletion to advantage in an appropriate circuit configuration.

Japanese Patent Laid-Open 2009-54999 describes a semiconductor device formed on a semiconductor substrate of a first conductivity type and equipped with a trench structure having a depth intermittently changing in the gate width direction, a gate electrode formed, via a gate insulating film, inside a trench portion defined by the trench structure and on the upper surface of a planar portion, a source region of a second conductivity type formed on one side of the gate electrode, and a drain region of a second conductivity type formed on the other side of the gate electrode. Portions of the source region and the drain region which face each other with the trench portion therebetween have a depth equal to or greater than the depth of the trench structure from the upper surface to the bottom portion. Due to this structure, a current which otherwise flows mainly around the upper surface of the recessed portion of the gate electrode starts flowing more uniformly through the whole trench portion, resulting in an increase in the effective gate depth of the recessed portion whose depth changes in the gate width direction. According to this document, a semiconductor device having such a configuration can have reduced on-resistance and enhanced transistor power.

Japanese Patent Laid-Open No. 2008-192985 describes a semiconductor device in which trench portions are formed in the gate width direction so as to provide a well with unevenness and a gate electrode is formed inside and on the upper surface of the trench portion via an insulating film. A source region is formed on one side of the gate electrode in the gate length direction and a drain region is formed on the other side. The source region and the drain region both have a depth reaching the vicinity of the bottom portion of the gate electrode (the vicinity of the bottom portion of the trench portion). By forming the source region and the drain region of such a depth, a current which otherwise flows mainly around a shallow portion of the gate electrode starts flowing more uniformly through the whole trench portion and an effective gate width increases due to the unevenness formed in the well. According to this document, a semiconductor device having such a configuration can have reduced on-resistance and enhanced transistor power.

Semiconductor devices obtained by extending a source region and a drain region to the vicinity of the bottom portion of the gate electrode as the configurations described in Japanese Patent Laid-Open No. 2008-192985 and 2008-192985 can be expected to have reduced on-resistance and enhanced transistor power.

The present inventors have however found that a problem occurs in a transistor having such a configuration in which a source region and a drain region are extended to the vicinity of the bottom portion of a gate electrode. The present inventors have found that in Vd–Id characteristics (drain voltage–drain current characteristics) of a transistor having such a configuration, an abnormal increase in Id occurs in a region where the drain voltage Vd is high. Measurement results of Vd–Id characteristics are shown in FIG. 22.

FIG. 23 illustrates the configuration of this semiconductor device. The semiconductor device illustrated herein includes a gate insulating film and a gate electrode 22 formed in a trench formed on a substrate and a channel 8 and a drain 13 formed on the substrate. The drain 13 is illustrated as one body in this diagram but may be comprised of a surface drain region having a high dopant concentration and an offset region formed below the drain region to cover it and having a low dopant concentration. A PN boundary line 30 is formed at the boundary between the drain 13 and the channel 8.

As illustrated in FIG. 22, particularly when a gate voltage Vg is 9V or greater, Id shows an abnormal increase (an area enclosed with a broken line in this diagram) from a drain voltage Vd of 15V or greater. The present inventors investigated a cause for this abnormality in the Vd–Id characteristics based on two-dimensional simulation. FIG. 23 shows the simulation results of a potential when a gate voltage (18V) and a drain voltage (16V) are applied to the gate electrode 22 and a drain electrode (not illustrated), respectively. It is apparent from the results that isoelectric lines are densely distributed at the lower corner of the trench of the gate electrode 22, suggesting electric field concentration. The present inventors have found that abnormality occurs in the Vd–Id characteristics because when the PN boundary line 30 between the drain 13 and the channel 8 exists in the vicinity of the lower corner of the trench, respective applications of a predetermined gate voltage and a predetermined drain voltage to the gate electrode 22 and the drain electrode cause electric field concentration at the lower corner of the trench, generate hot carriers at this portion markedly, and cause impact ionization to allow a substrate current to flow between the drain 13 and the substrate. Generation of such hot carriers deteriorates the long term reliability of the device.

SUMMARY

According to the present invention, there is provided a semiconductor device including: a substrate; a source region and a drain region, both of which are of a first conductivity type; a channel region of a second conductivity type between the source region and the drain region; a trench formed in the substrate between the source region and the drain region; a gate electrode formed in the trench; a first low-concentration region of the first conductivity type, between the source region and the channel region, having a first conductivity type dopant concentration lower than that of the source region; and a second low-concentration region of the first conductivity type, between the drain region and the channel region, having a first conductivity type dopant concentration lower than that of the drain region, wherein a sum of length measurements of the underlying portion of the second low-concentration region measured from the lower corner of the trench in a direction parallel to the substrate and in a direction perpendicular to the substrate is 0.1 μm or greater.

According to the present invention, there is provided a manufacturing method of a semiconductor device, comprising: forming a device isolation region on a substrate; implanting dopant ions of a first conductivity type in the substrate to form a first region and a second region, both of which are of a first conductivity type; implanting dopant ions of a second conductivity type between the first region and the second region to form a channel region; forming a mask to form a gate region in the channel region; forming a trench in the substrate by use of the mask; forming a gate electrode in the trench formed in the substrate; and forming a source region and a drain region by implanting, into the vicinity of the surface of the substrate on the first region and the second region, dopant ions of the first conductivity type having a dopant concentration higher than that of the first region and the second region, wherein the first region and the second region so that a sum of length measurements of the underlying portion of the second low-concentration region measured from the lower corner of the trench in a direction parallel to the substrate and in a direction perpendicular to the substrate is 0.1 μm or greater.

This configuration makes it possible to cover the lower corner of the trench, on the drain side, with the second low-concentration region and to locate a PN boundary line at a position distant from the lower corner of the trench on the drain side. Even when a voltage is applied to the gate electrode and drain electrode upon operation of a transistor to apply a predetermined voltage between the second low-concentration region and the channel region, electric field concentration to the lower corner of the trench can be prevented. This prevents generation of hot carriers and as a result, the long term reliability of the transistor is enhanced.

BRIEF DESCRIPTION OF THE DRAWINGS

The above and other objects, advantages and features of the present invention will be more apparent from the following description taken in conjunction with the accompanying drawings, in which:

FIG. 2 is a plan view illustrating a semiconductor device according to one embodiment of the present invention;

DETAILED DESCRIPTION OF PREFERRED EMBODIMENTS

Figure 1A:
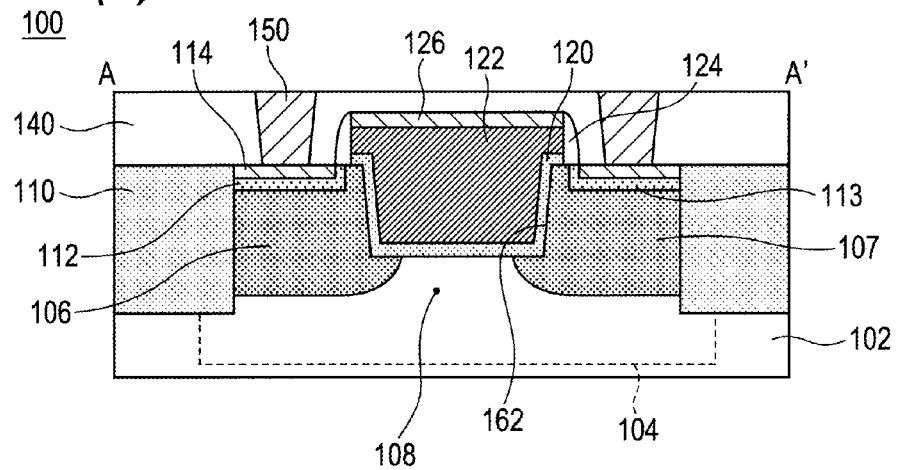
FIGS. 1(*a*), 1(*b*), and 1(*c*) are sectional views illustrating a semiconductor device according to one embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

In the drawings, like components bear like reference numerals and descriptions of such components are not necessarily repeated.

First Embodiment

Figure 1B:
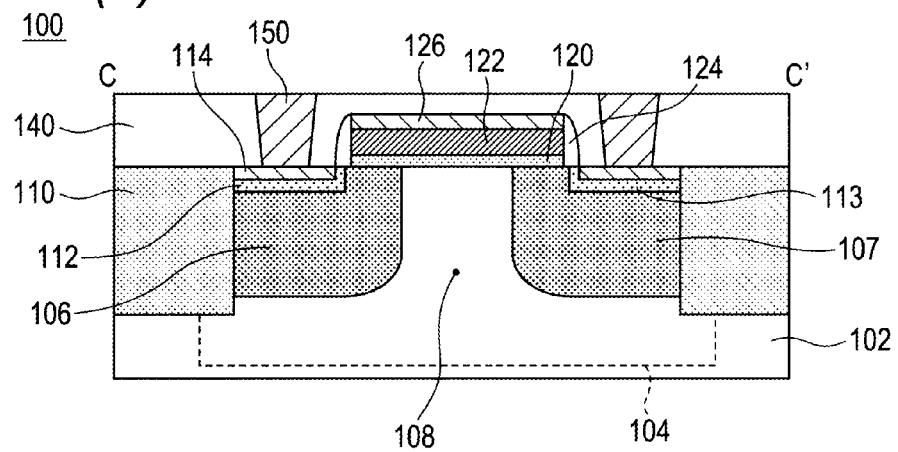
Figure 1C:
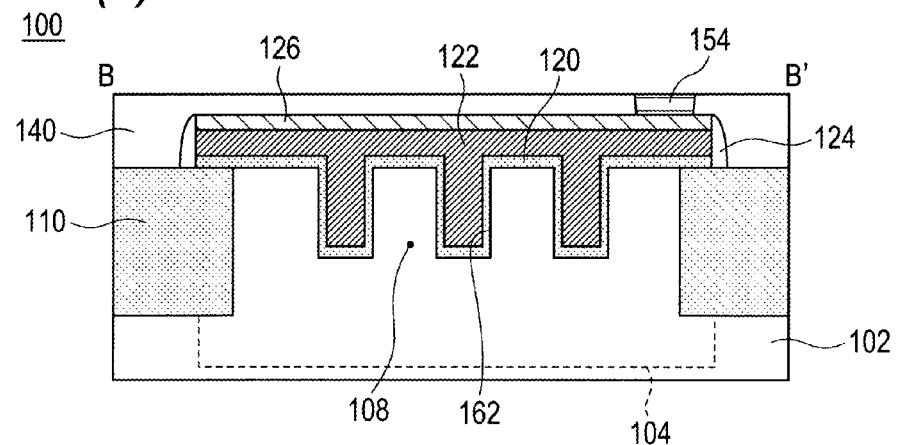

FIGS. 1(a), 1(b), and 1(c) are sectional views illustrating an embodiment of a semiconductor device according to the present invention. FIG. 2 is a plan view illustrating the embodiment of FIGS. 1(a), 1(b), and 1(c). FIG. 1(a) is a section along the line A-A' of FIG. 2; FIG. 1(b) is a section along the line C-C' of FIG. 2; and FIG. 1(c) is a section along the line B-B' of FIG. 2. To ensure that the configuration is easily understandable, in FIG. 2 each region is indicated by lines alone. In the following, a case where a first conductivity type is an n-type and a second conductivity type is a p-type is described as an example. However, a reverse case may also be applied to the present invention.

A semiconductor device 100 includes a substrate 102 and transistors formed on one surface of the substrate 102. The substrate 102 can be a semiconductor substrate such as a silicon substrate. A device isolation insulating film 110 is formed on one surface of the substrate 102. The device isolation insulating film 110 can have, for example, an STI (shallow trench isolation) configuration. In this embodiment, the film thickness of the device isolation insulating film 110 can be on the order of, for example, 300 nm to 1 µm.

In a region isolated by the device isolation insulating film 110, there are formed a well 104, which is a diffusion region of a dopant of a second conductivity type (a p-type), a source region 112 and a drain region 113, which are diffusion regions of a dopant of a first conductivity type (an n-type), and a first offset region 106 (first low-concentration region) and a second offset region 107 (second low-concentration region) which are provided underlying the source region 112 and the drain region 113, respectively, and are diffusion regions of a dopant of the first conductivity type (the n-type). The first offset region 106 and the second offset region 107 have a concentration of a dopant of the first conductivity type lower than that of the source region 112 and the drain region 113. The first offset region 106, the second offset region 107, the source region 112, and the drain region 113 are formed within the well 104. A region of the well 104 provided between the source region 112 and the drain region 113 and delimited by the first offset region 106 and the second offset region 107 becomes a channel region 108. In FIGS. 1(a) to 1(c), to make the configuration understandable, the well 104 is solely in broken line for ease of understanding.

In the present embodiment, the n-type dopant concentration of the first offset region 106 and the second offset region 107 can be on the order of, for example, $1\times10^{15}$ atoms/cm$^3$ to $1\times10^{18}$ atoms/cm$^3$. The n-type dopant concentration of the source region 112 and the drain region 113 can be on the order of, for example, $1\times10^{20}$ atoms/cm$^3$ to $1\times10^{22}$ atoms/cm$^3$. The boundary between the source region 112 and the first offset region 106 and the boundary between the drain region 113 and the second offset region 107 can be, for example, a position where the first conductivity type dopant concentration is $1\times10^{18}$ atoms/cm$^3$. The depth of the source region 112 and the drain region 113 can be on the order of, for example, 100 to 200 nm.

In this embodiment, the p-type dopant concentration of the well 104 can be on the order of, for example, $1\times10^{15}$ atoms/cm$^3$ to $1\times10^{17}$ atoms/cm$^3$.

The semiconductor device 100 includes, in the channel region 108 on the device side of the substrate 102, trenches 162 whose depth changes intermittently in the gate width direction, a gate electrode 122 formed so as to fill the trenches 162, a gate insulating film 120 formed between the gate electrode 122 and the substrate 102, and side walls 124 formed on the upper sidewall of the gate electrode 122. The trench 162 may have a long axis in the gate length direction (lateral direction in FIG. 2). The depth of the trench 162 can be on the order of, for example, 500 nm to 2 µm. In the semiconductor device 100 having such a configuration, when a predetermined voltage is applied to the gate electrode 122, a channel is formed in a region between the plural trenches 162 and the transistors work with both end portions, in the long axis direction, of the trench 162 as a source and a drain, respectively.

In this embodiment, the first offset region 106 and the second offset region 107 can be formed so that the lower ends thereof in a region in contact with the device isolation insulating film 110 are located above the lower end of the device isolation insulating film 110. It is therefore possible to prevent deterioration of the device isolation ability. In another example, however, the device isolation insulating film 110 can be made shallower than the depth of the first offset region 106 and the second offset region 107 or almost equal to the depth of the first offset region 106 and the second offset region 107.

In this embodiment, a silicide layer 114 is formed on the surfaces of the source region 112 and the drain region 113 and a silicide layer 126 is formed on the surface of the gate electrode 122. An interlayer dielectric film 140 is formed on the substrate 102. In the interlayer dielectric film 140, there are formed contacts 150 which are connected to the silicide layers 114, respectively, on the source region 112 and the drain region 113 and a contact 154 connected to the silicide layer 126 on the gate electrode 122.

In this embodiment, the first offset region 106 contacts the device isolation insulating film 110 and is formed underlying the entire surface of the source region 112 extending from the device isolation insulating film 110 to the trench 162. The second offset region 107 contacts the device isolation insulating film 110 and is formed underlying the entire surface of the drain region 113 extending from the device isolation insulating film 110 to the trench 162. The first offset region 106 and the second offset region 107, both of which are low-concentration regions, are formed on the side of the trench 162, on the lower corner of the trench 162, and on the predetermined range of the bottom portion of the trench 162. The lower corners of the trench 162 are covered by the first offset region 106 and the second offset region 107. Thanks to the above configuration, the transistor power can be kept high while reducing the on-resistance.

Further, in this embodiment, the second offset region 107 can be formed so that it covers the lower corner of the trench 162 and extends to a region below the bottom portion of the trench 162. In addition, the second offset region 107 can be formed so that a PN junction between the second offset region 107 and the well 104 is located with a predetermined distance from the lower corner of the trench 162.

Figure 10:
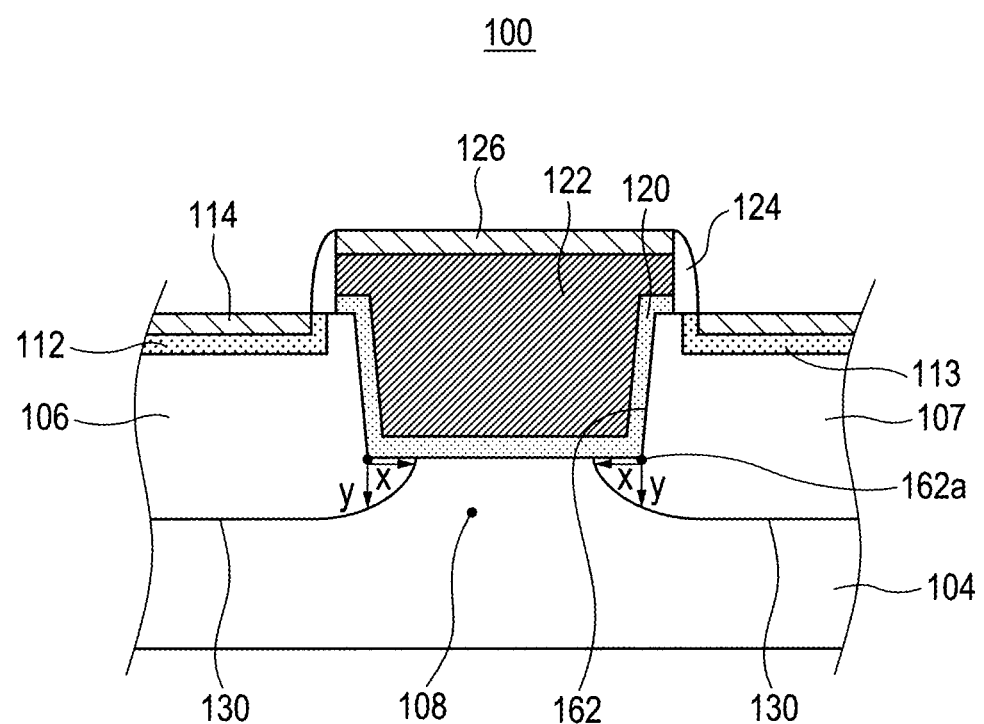
FIG. 10 is a schematic sectional view of the configuration of the semiconductor device in the embodiment.

A description will next be made referring to FIG. 10. FIG. 10 schematically illustrates a simplified configuration of the semiconductor device 100 illustrated in FIG. 1(a). FIG. 10 corresponds to the cross-section of the semiconductor device 100 in the gate length direction.

Assuming that in the cross-section in the gate length direction, a distance of the second offset region 107 starting from the corner portion 162a of the bottom portion of the trench 162 to the PN boundary line 130 between the second offset region 107 and the well 104 in the lateral direction toward the source region 112 is x and a distance of the second offset region 107 starting from the corner portion 162a of the bottom portion of the trench 162 in the downward direction is y, x+y is 0.1 μm or greater.

Reference to the PN boundary between the second offset region and the channel region is understood to mean the surface at which the n-type dopant of the second offset region and the p-type dopant of the channel region substantially counteract one another. More generally, the boundary between either the first or second offset region and the channel region is preferably defined as the surface at which the dopant impurities of the channel and the dopant impurities of the offset region substantially counteract one another. In a given device this will typically be an isoconcentration surface as regards the dopant impurity of the offset region, with the boundary line 130 shown in FIGS. 10, 11, 24 and 25 then being the intersection of the sectional plane A-A' with that surface.

Figure 11:
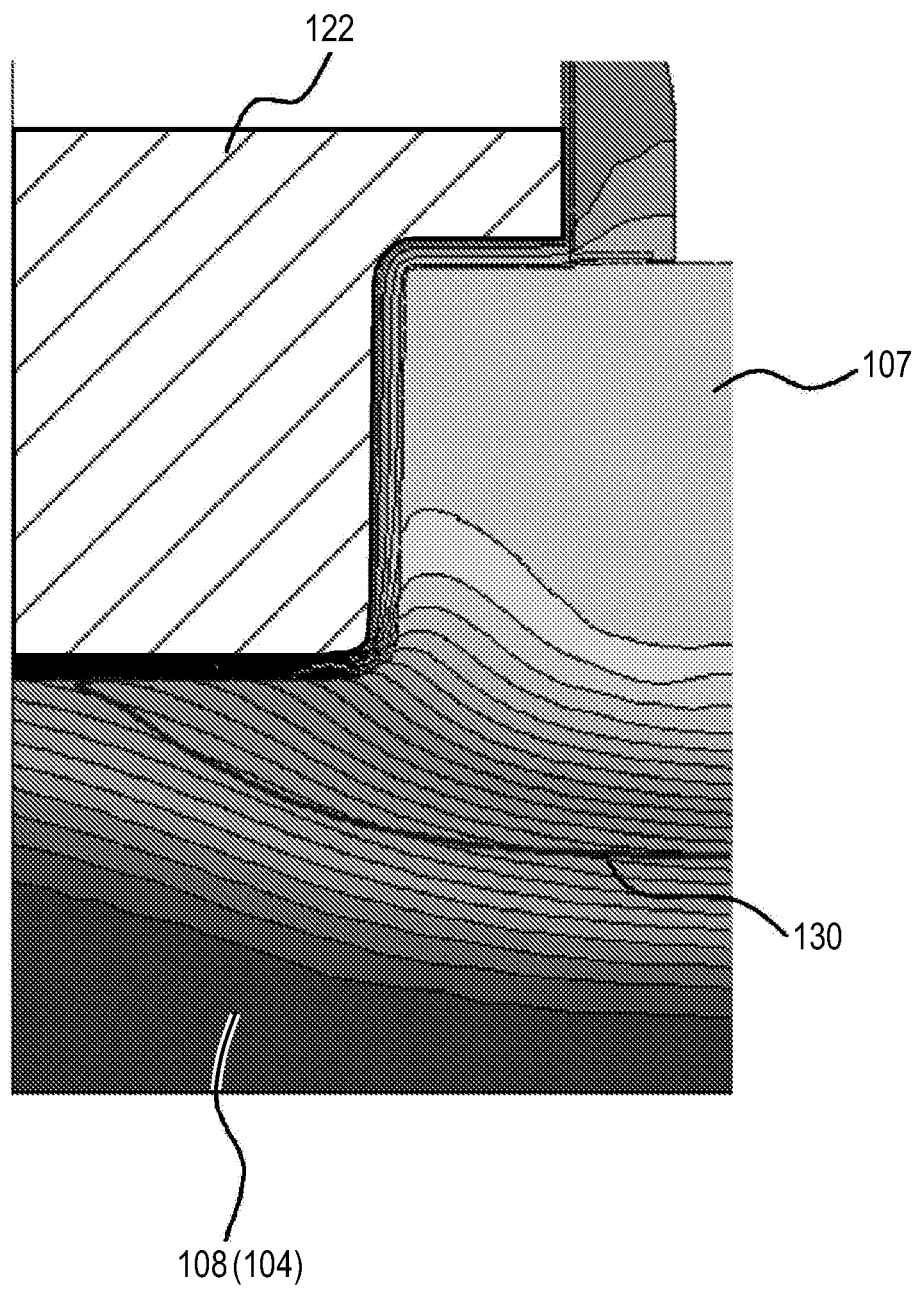
FIG. 11 shows simulation results of an electric field distribution when a gate voltage is applied to the gate electrode of the semiconductor device in the embodiment.
Figure 23:
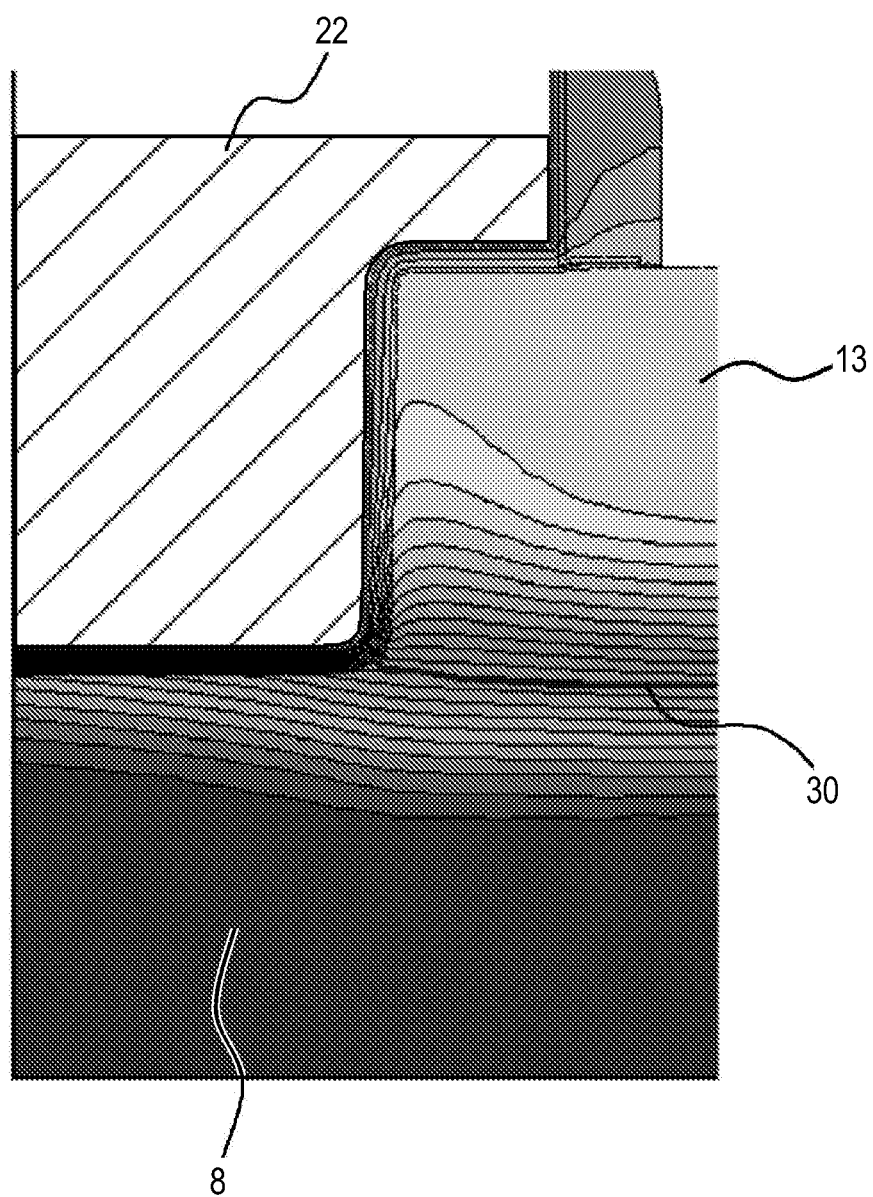
FIG. 23 is a graph illustrating an example of the configuration of the semiconductor device.

FIG. 11 shows simulation results of a potential when a gate voltage (18V) and a drain voltage (16V) are applied, respectively, to the gate electrode 122 and a drain electrode (not illustrated) of the semiconductor device 100 of this embodiment illustrated in FIGS. 1(a), 1(b), and 1(c). The distance x is set at 0.54 μm and the distance y is set at 0.26 μm. As is apparent from the results shown in FIG. 11, the density of equipotential lines at the lower corner of the trench becomes lower than that of the example illustrated in FIG. 23, suggesting the relaxation of the electric field in the device of this embodiment.

Figure 12A:
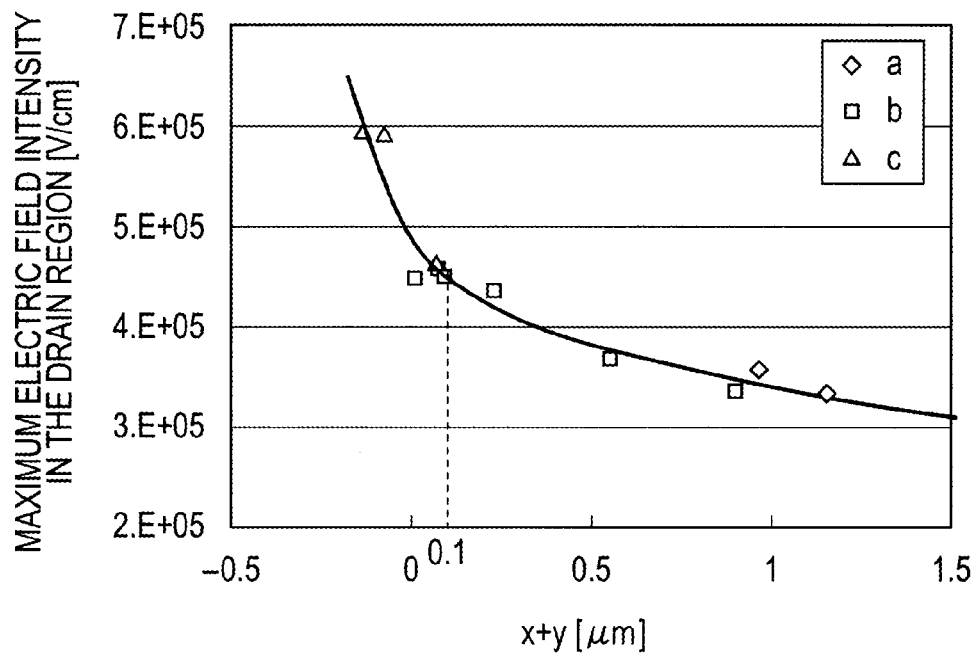
FIGS. 12(*a*) and 12(*b*) each shows a relationship between the distance x and the distance y and a substrate current.

FIG. 12(a) shows a relationship between a total distance (x+y) [μm] of the distance x and the distance y and the maximum electric field intensity in the drain region [V/cm].

The relationship between the total distance (x+y) and the maximum electric field intensity in the drain region is determined by using the plural semiconductor devices 100 different in the depth of the trench 162 and the shape of the second offset region 107. In the graph, the trench 162 of the semiconductor device "a" has a depth of 0.4 μm, the trench 162 of the semiconductor device "b" has a depth of 0.7 μm, and the trench 162 of the semiconductor device "c" is 1.0 μm. The term "maximum electric field intensity in the drain region [V/cm]" means the maximum value, obtained by simulation, of an electric field parallel to the traveling direction of carriers in the vicinity of the drain (the drain region 113 and the second offset region 107) in each configuration. The value (x+y) is obtained by simulation (Sim).

As is apparent from the graph, the greater the value of the total distance (x+y), the smaller the maximum electric field intensity in the drain region. A minus total distance (x+y) (smaller than zero) means that the second offset region 107 does not reach the lower corner of the trench 162. The relationship between the total distance (x+y) and the maximum electric field intensity in the drain region can be expressed by a curve shown in FIG. 12(a) irrespective of the configuration of the semiconductor device 100 and an inflection point exists at the total distance (x+y) of 0.1 μm. This means that irrespective of the configuration of the semiconductor device 100, the maximum electric field intensity in the drain region can be kept low at the total distance (x+y) of 0.1 μm or greater. When a predetermined voltage is applied to each of the gate electrode 122 and the drain region 113 to apply a predetermined voltage between the second offset region 107 and the channel region 108, electric field concentration occurs not only at the corner portion 162a of the trench 162 but also the vicinity thereof. When the total distance (x+y) becomes large, it is possible to prevent the PN junction from existing in a region in the vicinity of the corner portion 162a of the trench 162 where electric field concentration is apt to occur. Since electric field concentration is apt to occur also at the PN boundary portion, the maximum electric field intensity in the drain region is presumed to be reduced by making the PN boundary line 130 distant from the vicinity of the corner portion 162a of the trench 162. This makes it possible to prevent further concentration of an electric field to the lower corner of the trench, greatly reduce generation of hot carriers, improve the breakdown voltage, and thereby provide a transistor having long term reliability.

When the total distance (x+y) is about 0.5 μm or greater, the maximum electric field intensity in the drain region can be kept lower.

Figure 12B:
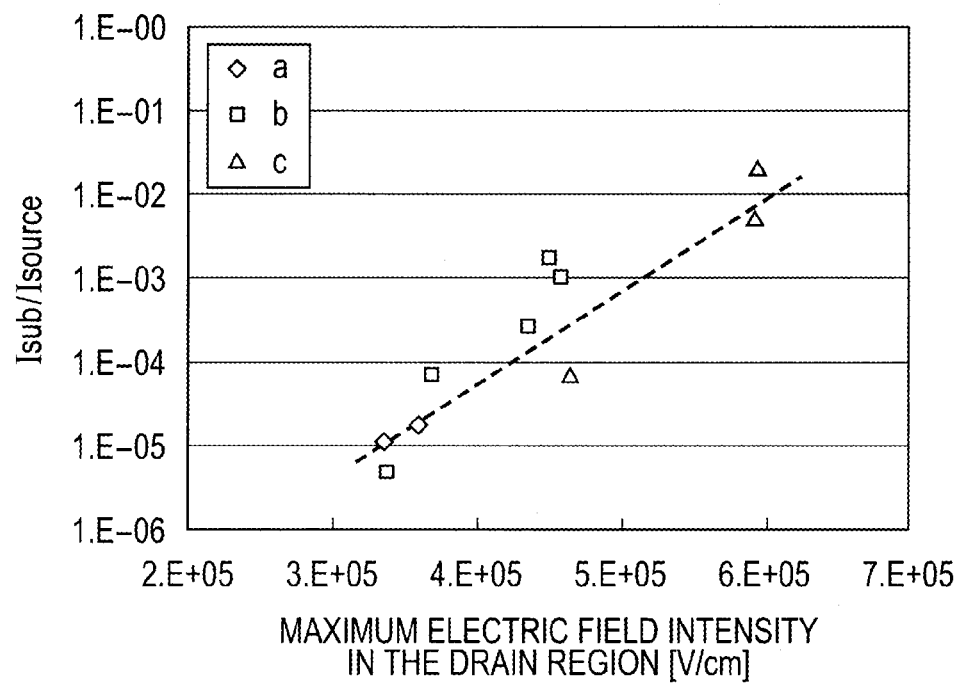

FIG. 12(b) shows a relationship between the maximum electric field intensity in the drain region [V/cm] of each of the semiconductor devices 100 having the configurations as shown in FIG. 12(a), respectively, and a substrate current ($I_{sub}/I_{source}$) [A]. The value (x+y) is a value obtained by simulation (Sim), while the substrate current ($I_{sub}/I_{source}$) is a measured value. As shown in FIG. 12(b), there is a proportional relationship between the maximum electric field intensity in the drain region and the substrate current ($I_{sub}/I_{source}$) [A] irrespective of the configuration of the semiconductor device 100. This means that the substrate current ($I_{sub}/I_{source}$) [A] can be decreased by decreasing the maximum electric field intensity in the drain region [V/cm].

Based on the data shown in FIG. 12(a), it has been found that the substrate current ($I_{sub}/I_{source}$) can be kept low when the total distance (x+y) is 0.1 μm or greater. Furthermore, the substrate current ($I_{sub}/I_{source}$) can be kept further lower when the total distance (x+y) is about 0.5 μm or greater.

A ratio (x:y) of the distance x to the distance y can be set at from 1:3 to 3:1. By carrying out ion implantation so as to satisfy the above condition, the shape of the PN boundary line 130 can be made more flat and the electric field can be relaxed. This makes it possible to prevent impact ionization and generation of hot carriers, thereby enhancing the long term reliability of the transistor.

Figure 24:
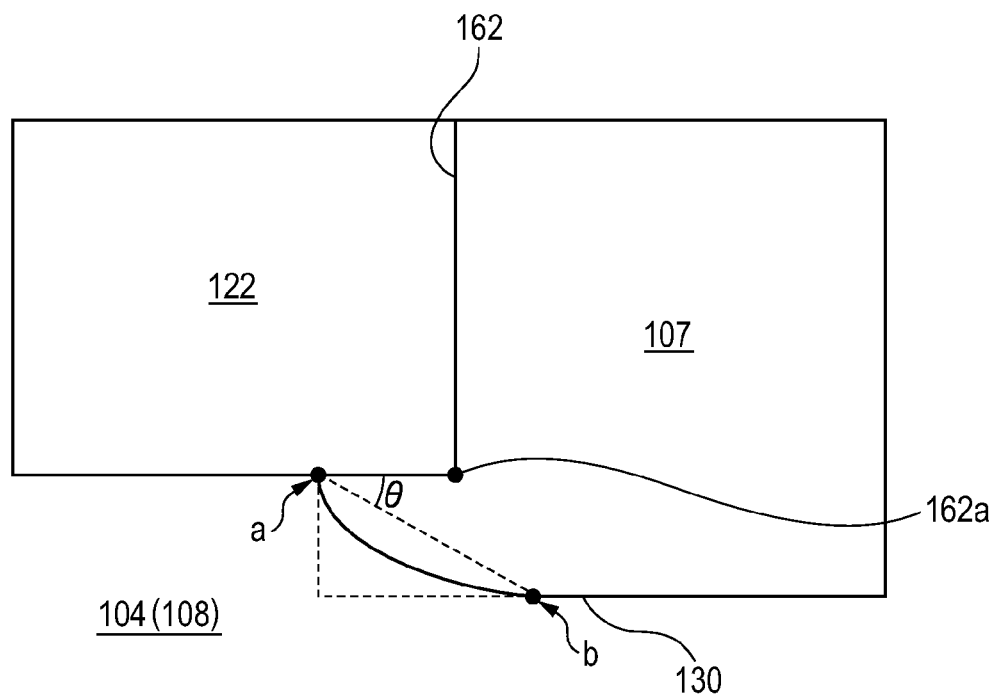
FIG. 24 is a schematic sectional view illustrating the configuration of the semiconductor device in this embodiment.

In addition, in a region below the trench 162, the second offset region 107 can be made gentle with a decreased curvature, which will next be described referring to FIG. 24. FIG. 24 is a sectional view schematically showing the gate electrode 122, the trench 162, and the second offset region 107.

The PN boundary line 130 of the second offset region 107 from the well 104 includes a linear portion parallel to the surface of the substrate and a curved portion rising up towards the bottom portion of the trench 162. The curved portion extending from the rising-up position (described as "b" in the drawing) from the linear portion at the bottom portion of the second offset region 107 to a position (described as "a" in the drawing) of the end portion of the second offset region 107 in contact with the bottom portion of the trench 162 can be made more gentle with a small curvature. From such a viewpoint, it is possible to adjust the angle θ formed between the straight line from a to b in the drawing and the bottom surface of the trench 162 to, for example, 72° or less. In addition, the angle θ can be adjusted to, for example, 18° or greater. The shape of the PN boundary line 130 can therefore be made gentle and the electric field can be relaxed. Also by this, impact ionization and generation of hot carriers can be prevented and the long term reliability of the transistor can be enhanced.

In this embodiment, a bidirectional transistor in which a configuration on the drain side and a configuration on the source side are made symmetrical can be used as the transistor of the semiconductor device 100. The first offset region 106 and the second offset region 107 can be formed so that they are bilaterally symmetrical in the cross-section in the gate length direction. Even when the source and the drain are used in a reverse-direction mode, this makes it possible to remarkably prevent generation of hot carriers and realize improvement of a breakdown voltage, thereby enhancing the long term reliability of the transistor.

Next, a procedure for manufacturing the semiconductor device 100 in this embodiment will be described.

FIGS. 3(a) and 3(b) to FIG. 8 are sectional views illustrating an example of steps of a procedure for manufacturing the semiconductor device 100 in this embodiment. These figures correspond to the A-A' sectional views and B-B' sectional view of FIG. 2, respectively.

The following description refers to forming n-type transistors, but the technique could likewise be applied to forming p-type transistors.

Figure 3A:
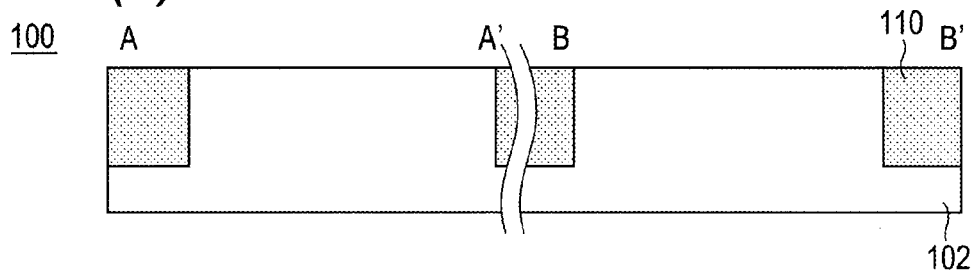
FIGS. 3(*a*) and 3(*b*) are sectional views illustrating an example of process for manufacturing the semiconductor device illustrated in FIGS. 1(*a*), 1(*b*), and 1(*c*)

First, a device isolation insulating film 110 is formed on one surface of a substrate 102 (FIG. 3(a)). Subsequently, a first offset region 106 and a second offset region 107 are formed on that surface of the substrate 102.

Figure 9:
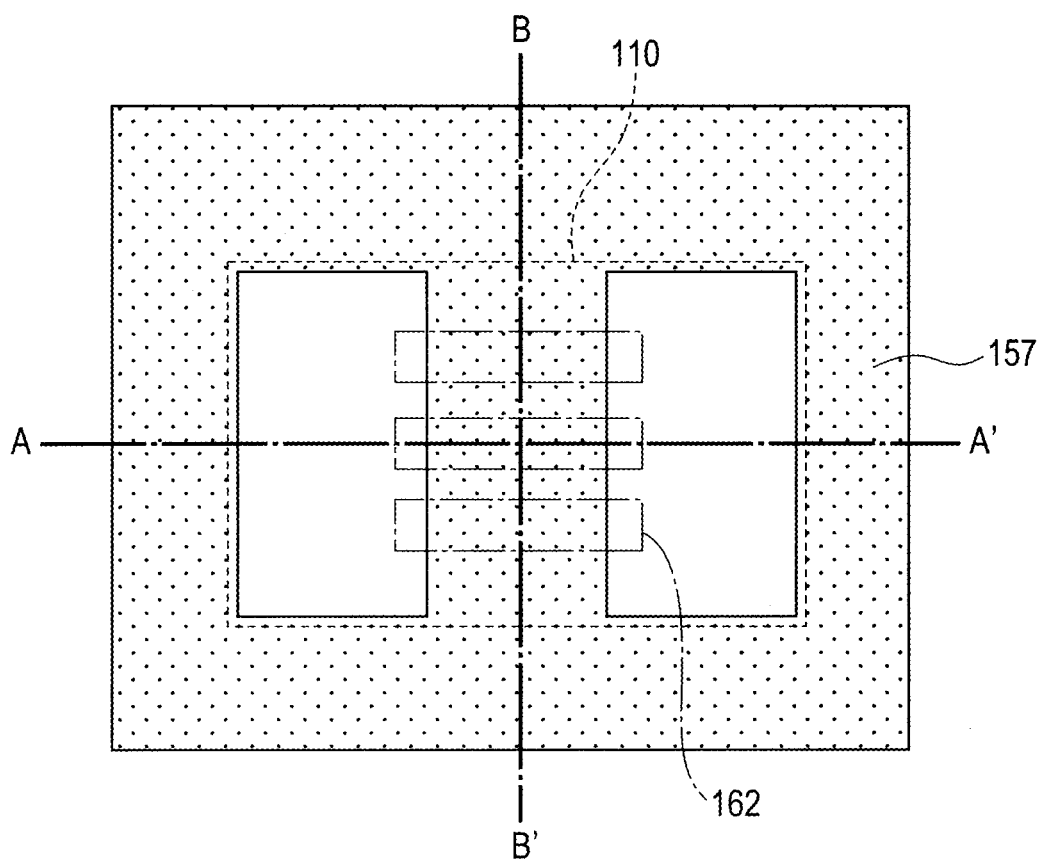
FIG. 9 is a plan view illustrating an example of a stage during the procedure for manufacturing the semiconductor device illustrated in FIGS. 1(*a*), 1(*b*), and 1(*c*)

First, a resist film 157 with openings corresponding to the intended locations of the first offset region 106 and the second offset region 107 is formed on one surface of the substrate 102. The position at which a trench 162 is to be formed is indicated with an alternate long and short dash line. FIG. 9 is a plan view illustrating the substrate at this stage. The openings of the resist film 157 can be formed so that a distance x of each of the first offset region 106 and the second offset region 107 illustrated in FIG. 10 be a desired value.

Figure 3B:
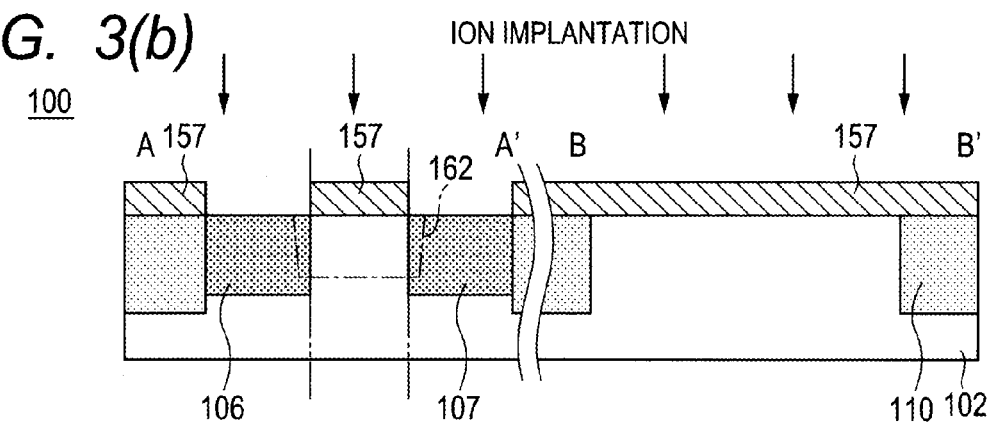

By use of the resist film 157 as a mask, the first offset region 106 and the second offset region 107 are formed on the whole exposed area of the substrate 102 by performing ion implantation of dopant ions of an n-type (first conductivity type) (FIG. 3(b)). This ion implantation can be performed in a vertical direction. In addition, the ion implantation can be performed under such a condition that the distance y of each of the first offset region 106 and the second offset region 107 illustrated in FIG. 10 be a desired value. As an example, the first offset region 106 and the second offset region 107 can be formed by implanting dopant ions of an n-type (first conductivity type) such as phosphorus ions under the conditions of 90 keV, $9\times10^{12}$ atoms/cm$^{-2}$+300 keV, $6\times10^{12}$ atoms/cm$^{-2}$. By this ion implantation, the first offset region 106 and the second offset region 107 having, for example, a dopant concentration on the order of $1\times10^{15}$ atoms/cm$^{-2}$ (PN boundary) to $2\times10^{17}$ atoms/cm$^{-2}$ can be obtained. After that, the resist film 157 is removed.

Figure 4A:
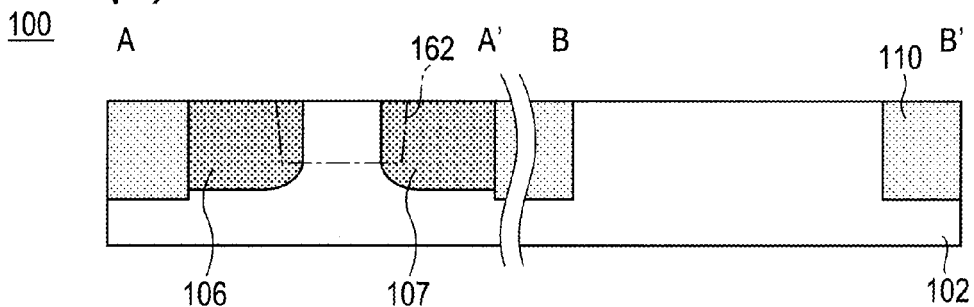
FIGS. 4(*a*) and 4(*b*) are sectional views illustrating an example of process for manufacturing the semiconductor device illustrated in FIGS. 1(*a*), 1(*b*), and 1(*c*)
Figure 4B:
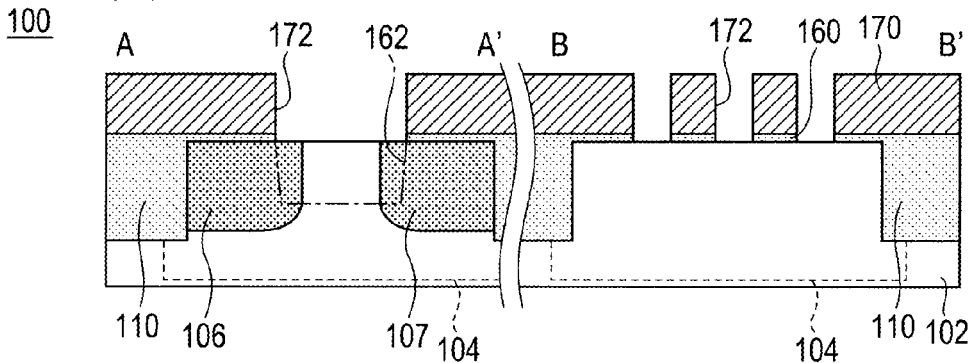

Heat treatment is then performed to diffuse the dopant ions configuring the first offset region 106 and the second offset region 107 (FIG. 4(a)). The shape of the openings of the resist film 157 and the ion implantation conditions can be determined in consideration of the diffusion amount of the dopant.

Subsequently, although not illustrated, a resist film with opening corresponds to the location of well 104 is formed on the substrate 102. Next, by use of the resist film as a mask, the well 104 is formed on the whole exposed area of the substrate 102 by performing the ion implantation of dopant ions of a p-type (a second conductivity type). The well 104 is formed by performing ion implantation of dopant ions of a p-type (a second conductivity type) such as boron (B) ions under the conditions of, for example, 800 keV, $1\times10^{13}$ atoms/cm$^{-2}$+200 keV, $1\times10^{12}$ atoms/cm$^{-2}$. By this ion implantation, the well 104 having, for example, a dopant concentration of $1\times10^{15}$ atoms/cm$^{-3}$ (substrate) to $1\times10^{17}$ atoms/cm$^{-3}$ can be obtained. In this embodiment, at the PN boundary lines between the first offset region 106 and the channel region 108 and the second offset region 107 and the channel region 108, the dopant concentration of the first offset region 106 and the second offset region 107 is higher than that of the channel region 108 and the PN boundary line can therefore be delimited by forming the first offset region 106 and the second offset region 107 by ion implantation. This makes it possible to form the PN boundary line having an arc in a depth direction, make the density gradient more gradual, and suppress generation of hot carriers. After that, the resist film is removed.

Subsequently, a thermally-oxidized film 160 is formed on the device side surface of the substrate 102 and on top of this thermally-oxidized film 160 there is formed a resist film 170 in which an opening 172 for forming a trench 162 is formed. An insulating film used as the thermally-oxidized film 160 may be a CVD oxide film or nitride film, or a combination of them. Next, the substrate 102 is etched through the opening 172 to remove the thermally-oxidized film 160 using the resist film 170 as a mask, (FIG. 4(b)). After that, the trench 162 is formed on the substrate 102 by plasma etching of the substrate 102 using the resist film 170 as a mask (FIG. 5(a)). After that, the resist film 170 is removed. It is possible to adopt another method such as removing the thermally-oxidized film 160 within the opening 172 by use of the resist film 170 as a mask, removing the resist 170 thereafter, and forming the trench 162 by use of the remaining thermally-oxidized film 160 as a mask.

Figure 5A:
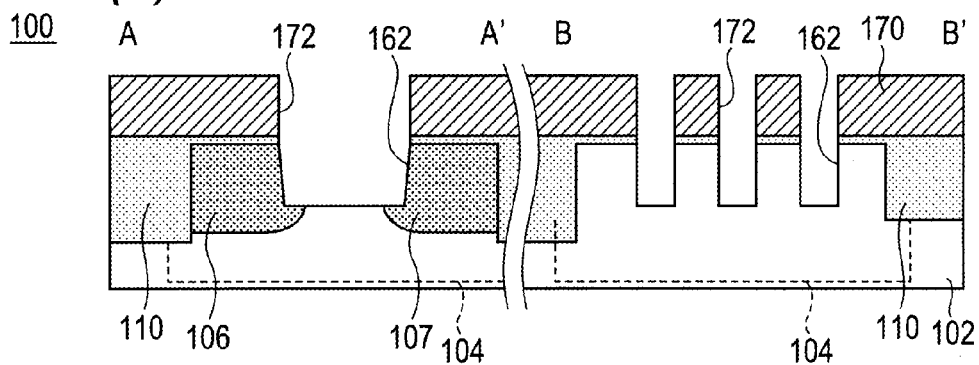
FIGS. 5(*a*) and 5(*b*) are sectional views illustrating an example of process for manufacturing the semiconductor device illustrated in FIGS. 1(*a*), 1(*b*), and 1(*c*)
Figure 5B:
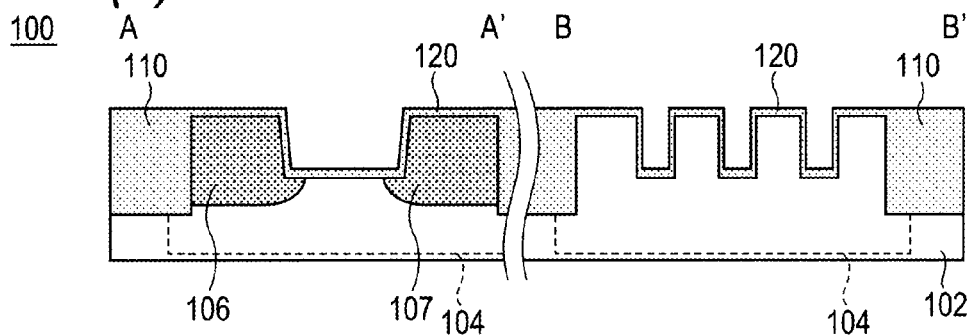
Figure 6A:
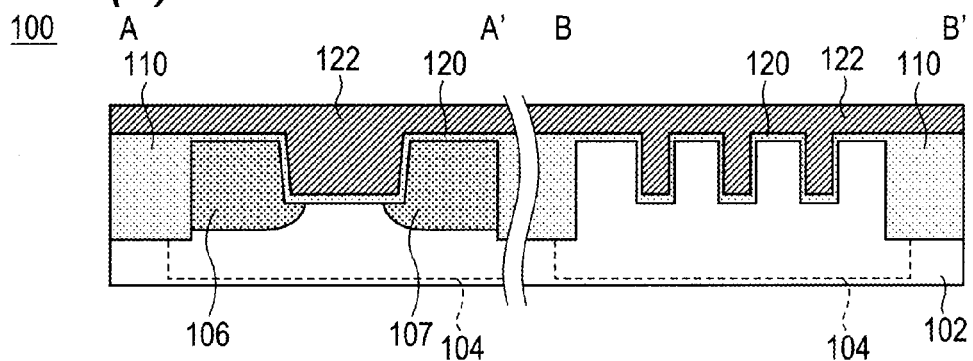
FIGS. 6(*a*) and 6(*b*) are sectional views illustrating an example of process for manufacturing the semiconductor device illustrated in FIGS. 1(*a*), 1(*b*), and 1(*c*)
Figure 6B:
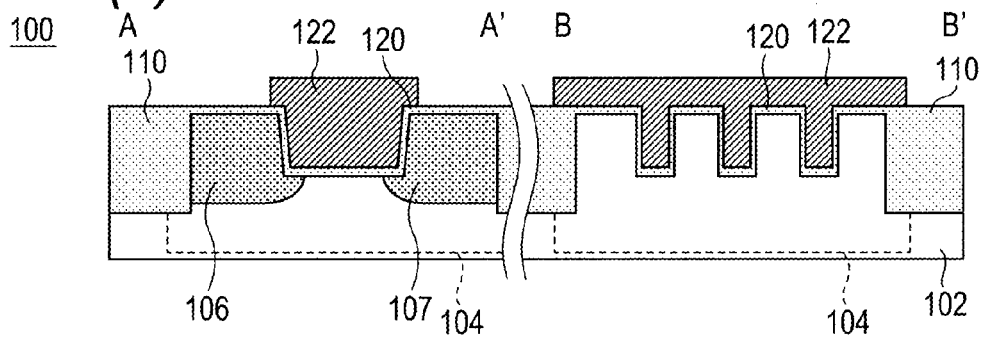

Subsequently, after the temporary removal of the thermally-oxidized film 160 with diluted fluorine or the like, a gate insulating film 120 is formed in the trench 162 and on the surface of the substrate 102 by thermally oxidizing the surface of the substrate 102 (FIG. 5(b)). The gate insulating film 120 may be a CVD oxide film. After that, a conductive film which becomes a gate electrode 122, is formed on the whole area of the substrate 102 (FIG. 6(a)). The conductive film which becomes the gate electrode 122 can be formed from polysilicon, for example. Next, the gate electrode 122 and the gate insulating film 120 are patterned in a gate shape (FIGS. 6(b) and 7(a)).

Figure 7A:
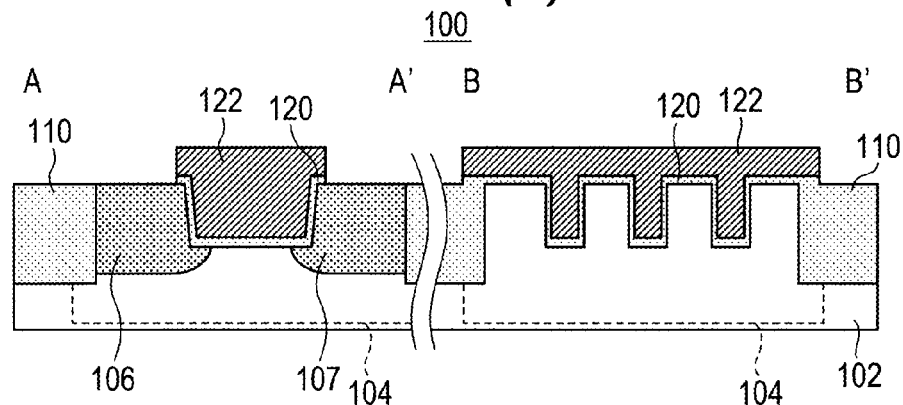
FIGS. 7(*a*) and 7(*b*) are sectional views illustrating an example of process for manufacturing the semiconductor device illustrated in FIGS. 1(*a*), 1(*b*), and 1(*c*)
Figure 7B:
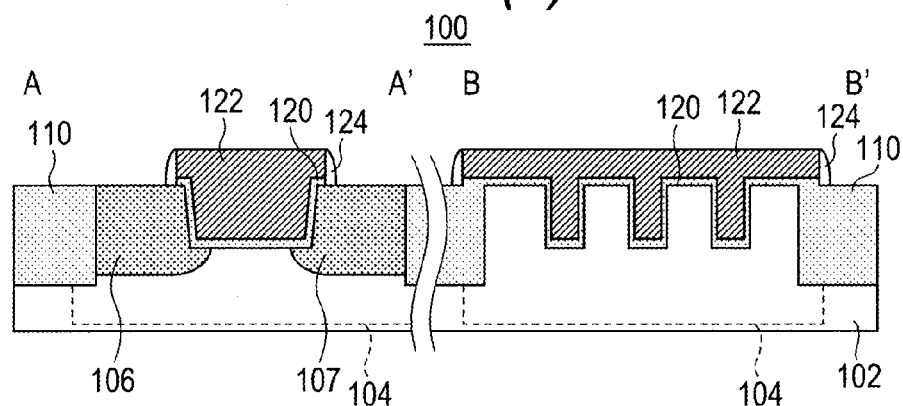
Figure 8:
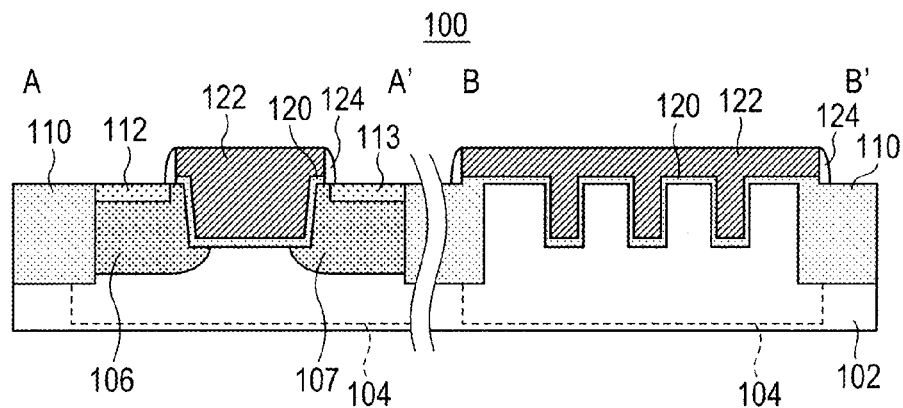
FIG. 8 is a sectional view illustrating an example of process for manufacturing the semiconductor device illustrated in FIGS. 1(*a*), 1(*b*), and 1(*c*)

Subsequently, a side wall 124 is formed on the upper side wall of the gate electrode 122 (FIG. 7 (b)). The side wall 124 can be formed from an insulating film of an oxide film, a nitride film or the like. After that, a source region 112 and a drain region 113 are formed by ion implantation of n-type dopant ions, such as phosphorus (P) ions, on the substrate 102 using the gate electrode 122 and the side wall 124 as masks (FIG. 8). In this embodiment, the source region 112 and the drain region 113 are manufactured using ion implantation steps different from those employed for the first offset region 106 and the second offset region 107. This makes it possible to form the first offset region 106 and the second offset region 107 into desired shapes and keep the breakdown voltage of the transistor desirably high. Further, in this embodiment, the source region 112 and the drain region 113 do not extend to the trench 162. This makes it possible to increase the distance between the drain region and the gate, thereby suppressing GIDL (gate induced drain leakage).

Subsequently, a silicide layer 114 and a silicide layer 126 are formed on the surface of the substrate 102 and the surface of the gate electrode 122, respectively. As a result of this, the semiconductor device 100 of the configuration shown in FIGS. 1(a) to 1(c) can be obtained.

The advantage of the semiconductor device 100 in this embodiment will next be described.

In this embodiment, since the first offset region 106 and the second offset region 107 having a low concentration and of the same conductivity type as that of the source region 112 and the drain region 113 are formed between the source region 112 and the channel region 108 and between the drain region 113 and the channel region 108, respectively, it is possible to increase the breakdown voltage of the transistor. Further, in this embodiment, the first offset region 106 and the second offset region 107 are formed over the side and bottom corner portion of the trench 162 in which the gate electrode 122 is to be formed, the transistor power can be kept high.

Still further, in this embodiment, the PN boundary line 130 can be located at a position distant from the lower corner of the trench on the drain side. Even when predetermined voltages are applied to the gate electrode 122 and the drain electrode (not illustrated), respectively, upon operation of the transistor, electric field concentration to the lower corner of the trench can be prevented. This makes it possible to greatly suppress the generation of hot carriers, realize improvement of a breakdown voltage, and enhance the long term reliability of the transistor.

Figure 25:
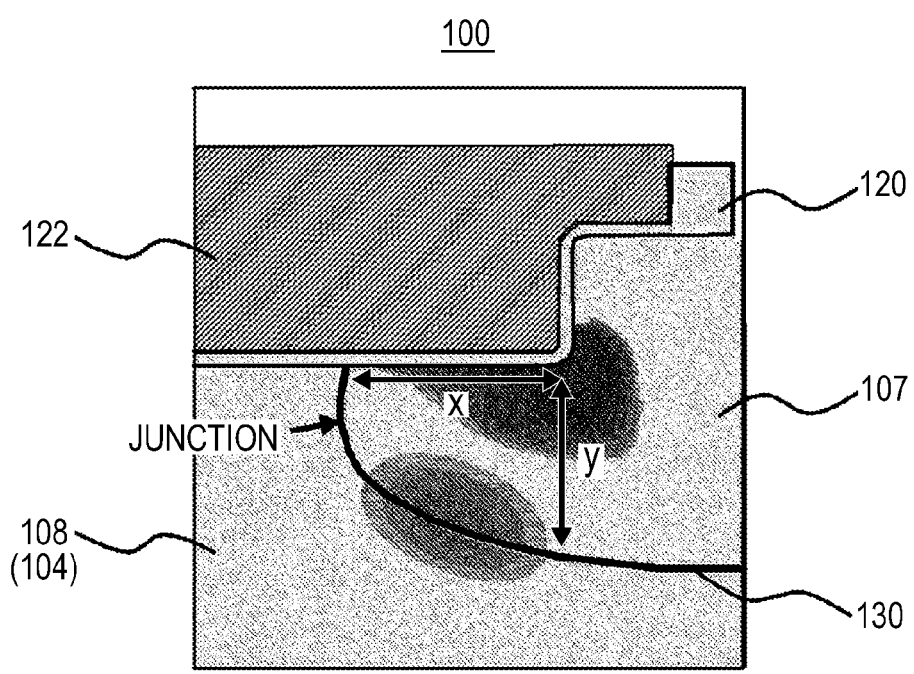
FIG. 25 is a view illustrating the advantage of the semiconductor device in this embodiment of the present invention.
Figure 26A:
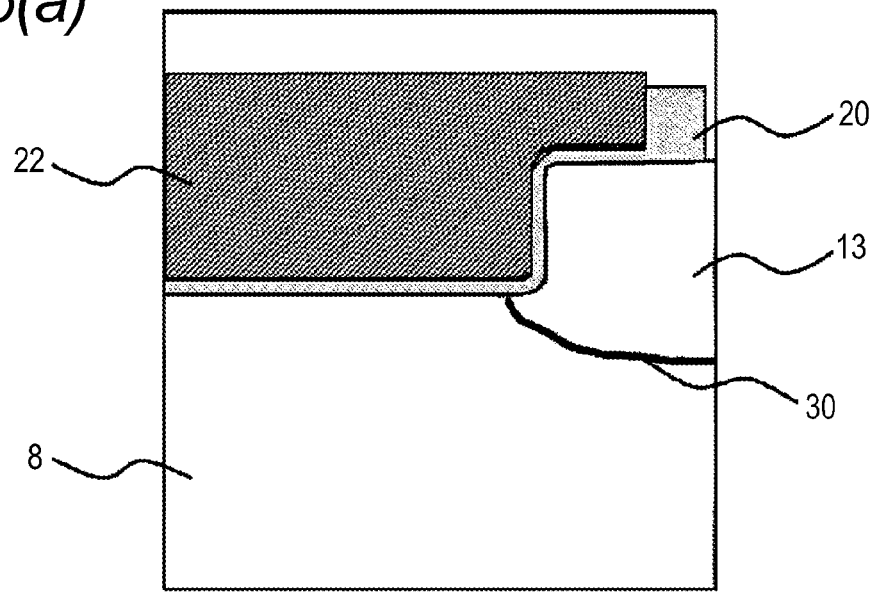
FIGS. 26(*a*) and 26(*b*) are each a view illustrating an example of the configuration of the semiconductor device.
Figure 26B:
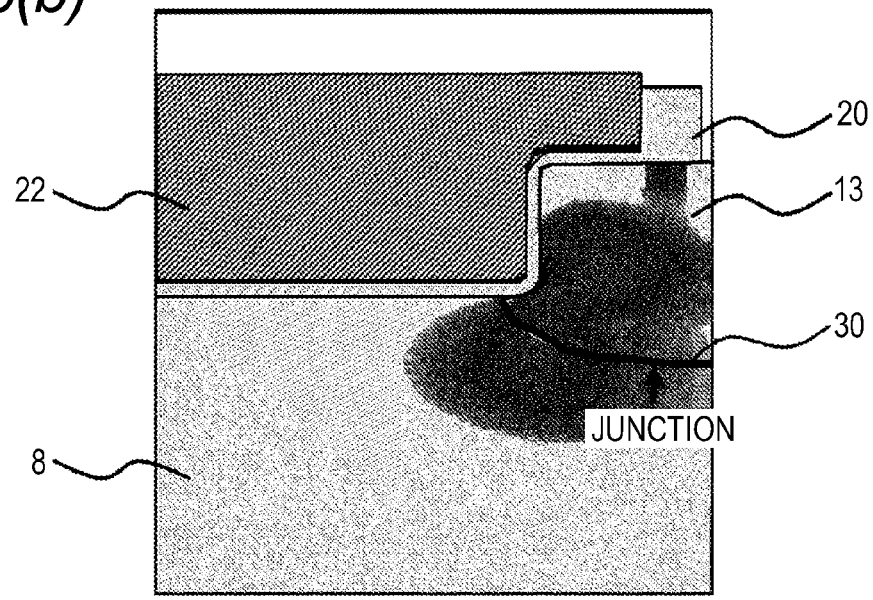

FIG. 26(b) shows the simulation results of an impact ionization ratio when, in a semiconductor device having a PN boundary line 30 in the vicinity of the lower corner of a trench, predetermined voltages are applied to a gate electrode 22 and a drain electrode (not illustrated), respectively. FIG. 26(a) is a sectional view showing the configuration of this semiconductor device. It can be understood that the impact ionization ratio is high at the bottom portion of the corner portion of the trench in which the gate electrode 22 is formed. On the other hand, FIG. 25 shows the simulation results of an impact ionization ratio when, in the semiconductor device 100 having the configuration of this embodiment, predetermined voltages are applied to the gate electrode 122 and the drain electrode (not illustrated), respectively. As is apparent from FIG. 25, the impact ionization ratio, which is marked at the lower corner of the trench in the example shown in FIG. 26(b), decreases. This makes it possible to greatly suppress the generation of hot carriers.

In this embodiment, at the PN boundary line between the first offset region 106 and the channel region 108 and between the second offset region 107 and the channel region 108, the dopant concentration of the first offset region 106 and the second offset region 107 is higher than the dopant concentration of the channel region 108. Thus, the PN boundary line can be defined by forming the first offset region 106 and the second offset region 107 by ion implantation. This makes is possible to relax the concentration gradient at the PN boundary line and suppress generation of hot carriers.

Further, in this embodiment, an angle θ between the bottom surface of the trench 162 and a straight line from the rising up position from the linear portion of the PN boundary line 130 between the second offset region 107 and the well 104 to a position of the end portion of the second offset region 107 contiguous to the bottom of the trench 162 is adjusted to, for example, 72 degrees or less, whereby the curved portion can be made gradual with a small curvature. This contributes to flattening of the shape of the PN boundary line 130 and relaxation of the electric field. This also makes it possible to realize impact ionization, prevent generation of hot carriers, and enhance the long term reliability of the transistor.

In the configuration described in Japanese Patent Laid-Open No. 2008-192985, a boundary between an N-type well corresponding to the second offset region 107 and a P-type region corresponding to the channel region 108 is formed by implanting a P-type ion into the N-type well, thereby providing the P-type region. The PN boundary region therefore becomes linear at the end portions of the N-type well and the P-type region. It is presumed that such a configuration cannot prevent generation of hot carriers because electric field concentration occurs at the boundary region.

Further, in this embodiment, in regions where the first offset region 106 and the second offset region 107 are formed so that the lower ends thereof, where they contact the device isolation insulating film 110, are shallower than the device isolation insulating film 110. It is therefore possible to prevent deterioration of the device isolation ability without necessarily carrying out additional measures such as increasing the width of the device isolation insulating film 110. This in turn makes it possible to prevent an increase in the chip size.

Second Embodiment

Figure 13A:
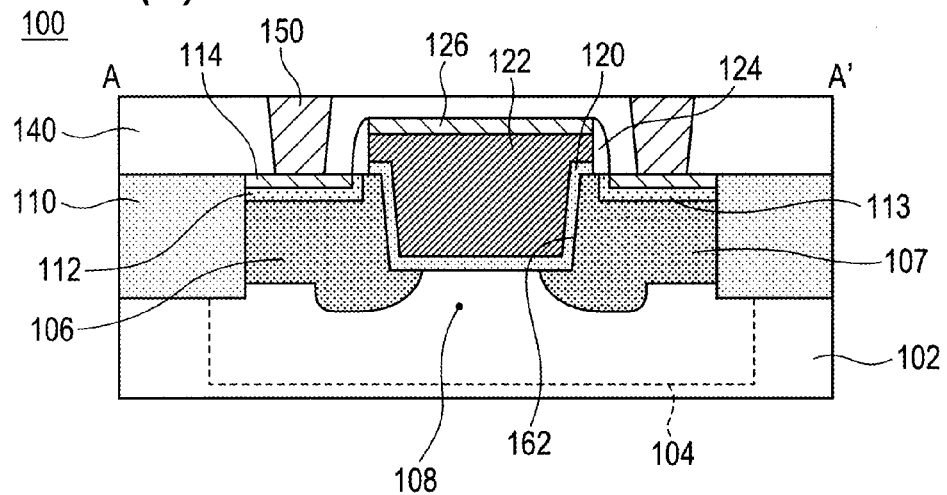
FIGS. 13(*a*), 13(*b*), and 13(*c*) are sectional views illustrating another example of the configuration of the semiconductor device in the embodiment of the invention.
Figure 13B:
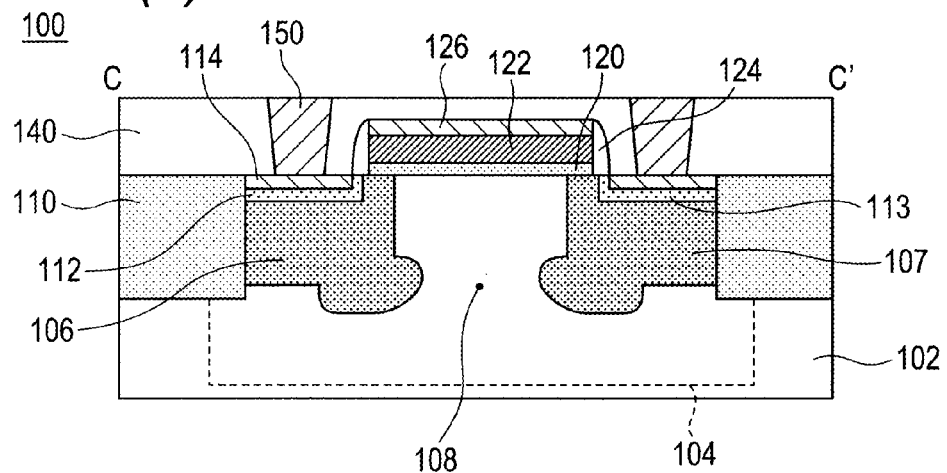
Figure 13C:
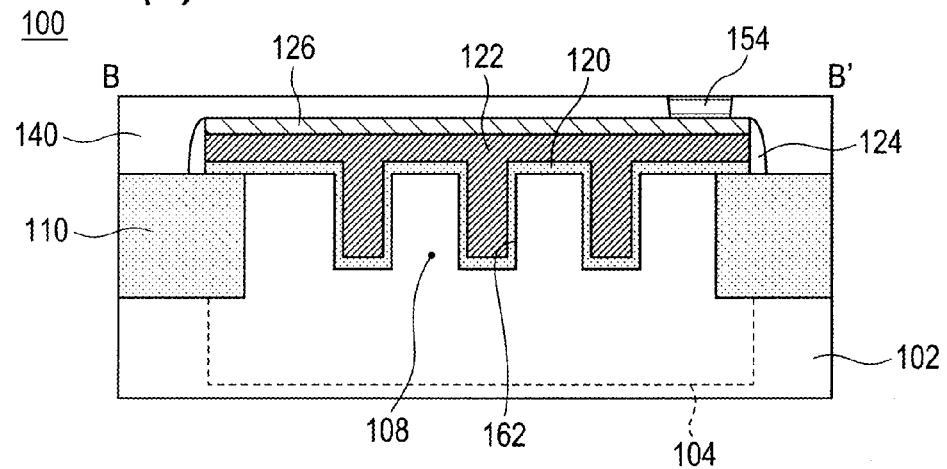

FIGS. 13(a), 13(b), and 13(c) are sectional views illustrating an embodiment of a semiconductor device according to this embodiment. A semiconductor device 100 in this second embodiment has a similar planar configuration to that shown in FIG. 2. FIG. 13(a) is a section along the line A-A' of FIG. 2; FIG. 13(b) is a section along the line C-C' of FIG. 2; FIG. 13(c) is a section along the line the B-B' of FIG. 2. In the following, a case where a first conductivity type is an n-type and a second conductivity type is a p-type is described as an example. However, a reverse case may also be applied to the present invention.

In this embodiment, the shape of the first offset region 106 and the second offset region 107 is different from that shown in FIGS. 1(a), 1(b), and 1(c). In this embodiment, the first offset region 106 and the second offset region 107 each has a depth, in the area where they contact the bottom of trench 162, greater than their depth where they make contact with the device isolation insulating film 110. In a sectional view, the first offset region 106 and the second offset region 107 are each provided with a step difference which is deeper on the side near the trench 162 and shallower on the side near the device isolation insulating film 110.

In this embodiment, the first offset region 106 and the second offset region 107 can be formed by performing ion implantation in two stages, which will be described referring to FIGS. 14 to 17.

Figure 16:
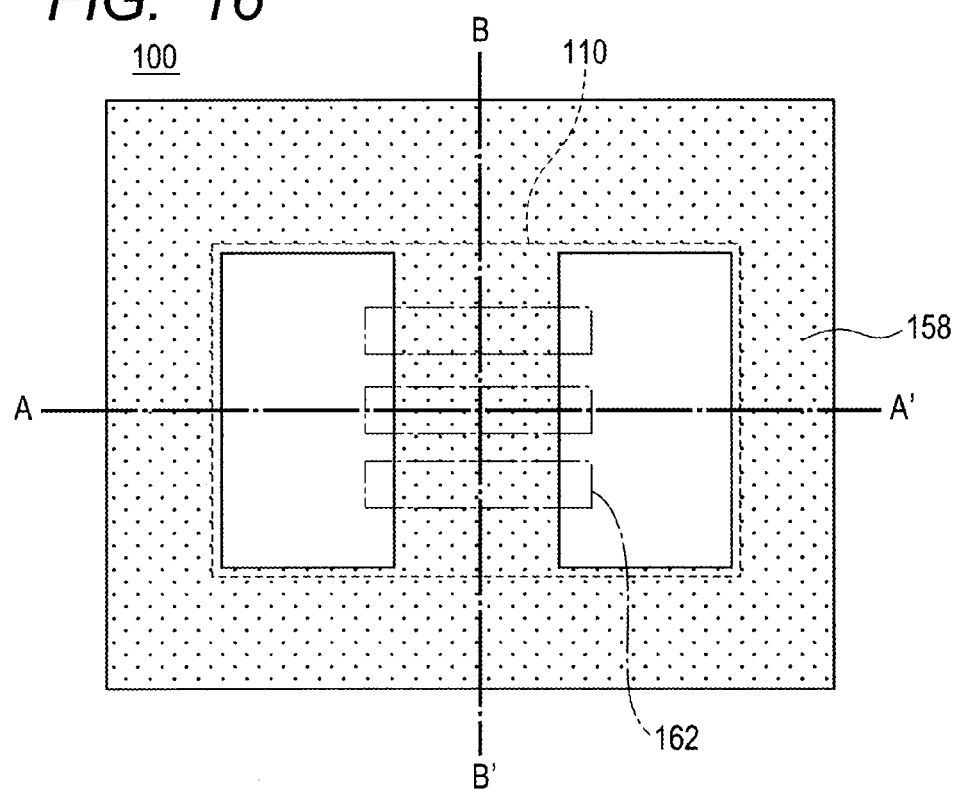
FIG. 16 is a plan view illustrating an example of a stage during a procedure for manufacturing the semiconductor device illustrated in FIGS. 13(*a*), 13(*b*), and 13(*c*)

A device isolation insulating film 110 is formed on one surface of a substrate 102 in a procedure similar to that described referring to FIG. 3(a) in the first embodiment. Subsequently, a resist film 158 with openings corresponding to the intended locations of the first offset region 106 and a second offset region is formed on one surface of the substrate 102 (FIG. 14(a)). FIG. 16 is a plan view showing the state at this stage. Subsequently, by use of the resist film 158 as a mask, the first offset region 106 and the second offset region 107 are formed on the whole exposed area of the substrate 102 by performing ion implantation of dopant ions of an n-type (first conductivity type) such as phosphorus (P) ions. Ion implantation can be performed in a vertical direction. After that, the resist film 158 is removed.

Figure 17:
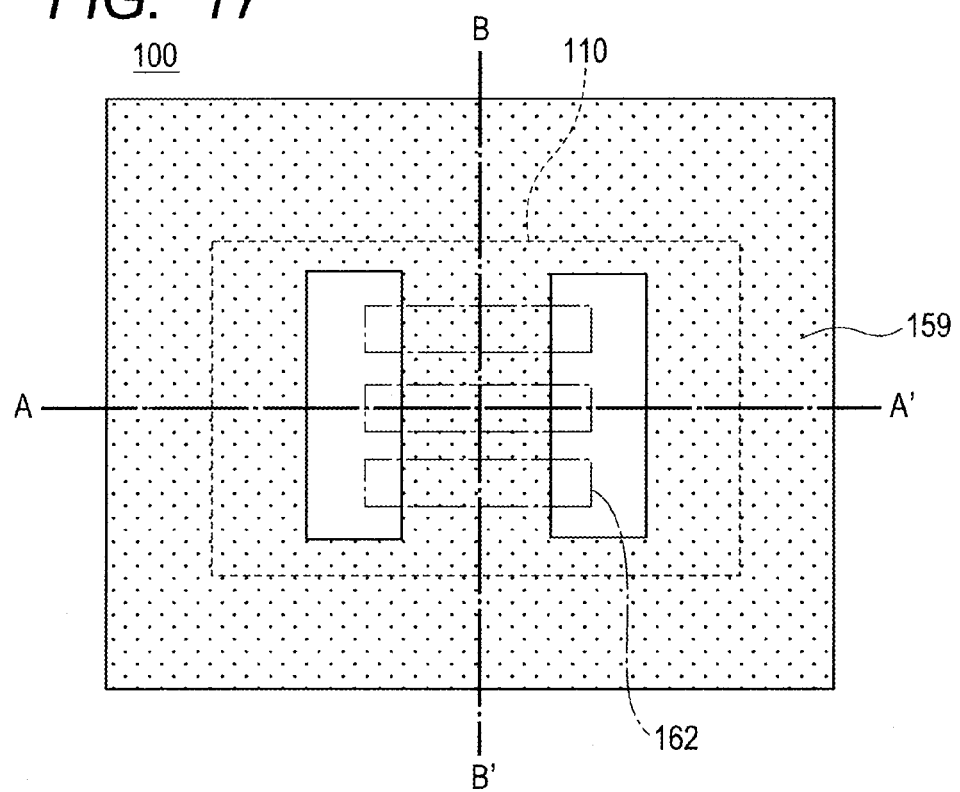
FIG. 17 is a plan view illustrating an example of a stage during a procedure for manufacturing the semiconductor device illustrated in FIGS. 13(*a*), 13(*b*), and 13(*c*)

Subsequently, on the same surface of the substrate 102, a resist film 159 is formed whose openings correspond with the regions where the first offset region 106 and the second offset region 107 will contact trench 162. FIG. 17 is a plan view showing the state at this stage. It will be noted that the openings in resist film 159 do not overlap the isolation film 110 in either the gate length direction or in the width direction. The openings of the resist film 159 can be shaped so that the distance x of the first offset region 106 and the second offset region 107 illustrated in FIG. 10 be a desired value.

Figure 14A:
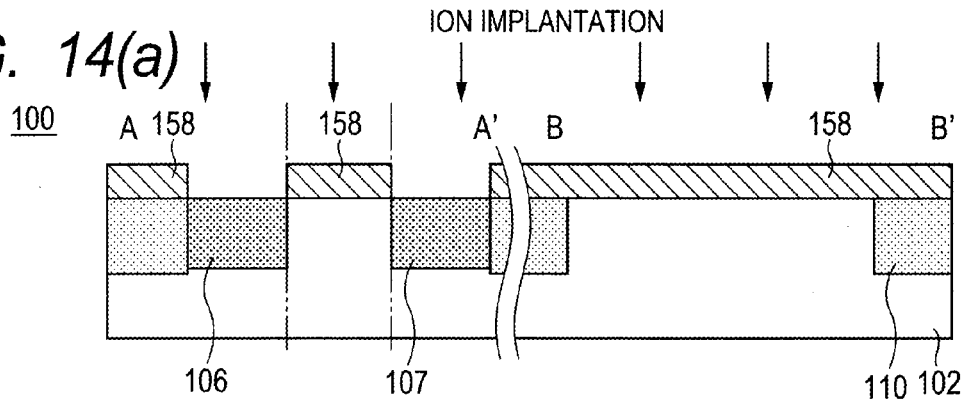
FIGS. 14(*a*) and 14(*b*) are sectional views illustrating an example of process for manufacturing the semiconductor device illustrated in FIGS. 13(*a*), 13(*b*), and 13(*c*)
Figure 14B:
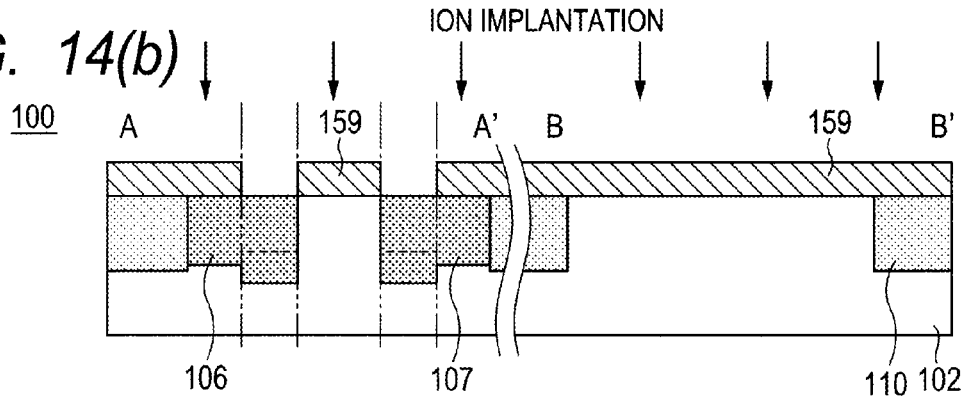
Figure 15A:
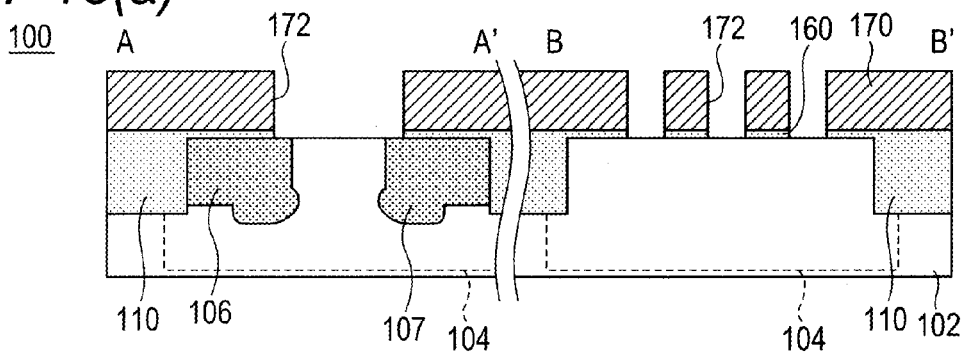
FIGS. 15(*a*) and 15(*b*) are sectional views illustrating an example of process for manufacturing the semiconductor device illustrated in FIGS. 13(*a*), 13(*b*), and 13(*c*)
Figure 15B:
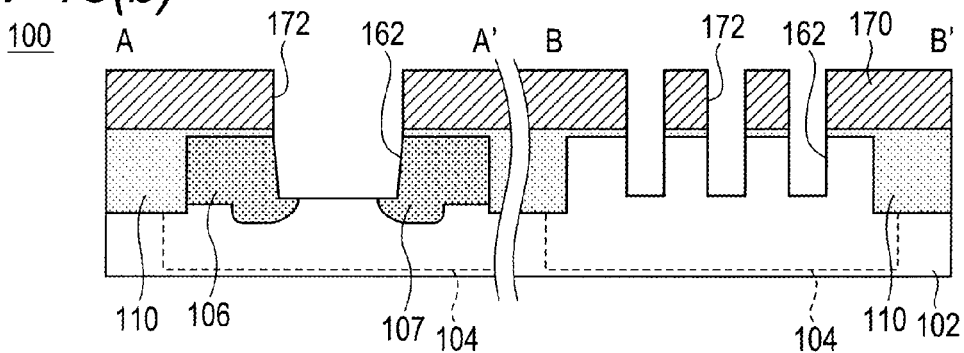

Subsequently, by use of the resist film 159 as a mask, dopant ions of an n-type (first conductivity type) such as phosphorus ions are implanted into the whole exposed area of the substrate 102 (FIG. 14(b)). In this step, the ion implantation is performed with a region enclosed with a broken line in FIG. 14(b) as a target. This means that the ion plantation is performed with a position deeper than that in the ion implantation shown in FIG. 14(a) as a target. Further, the ion implantation can be performed under such a condition that the distance y of the first offset region 106 and the second offset region 107 illustrated in FIG. 10 be a desired value. After that, the resist film 159 is removed. The ion implantation illustrated in FIG. 14(a) and the ion implantation illustrated in FIG. 14(b) may be conducted in any order.

Subsequently, the dopant ions configuring the first offset region 106 and the second offset region 107 are diffused by heat treatment. The shape of the openings of the resist film 159 and the condition of the ion implantation using it may be determined in consideration of the diffusion amount of the dopant.

Then, a well 104 is formed in a procedure similar to that described in the first embodiment. Subsequently, a thermally-oxidized film 160 is formed on one surface of the substrate 102, and on top of this thermally-oxidized film 160 there is formed a resist film 170 in which an opening 172 for forming a trench 162 is formed. Next, the substrate 102 is exposed within the opening 172 by removing the thermally-oxidized film 160 by etching using the resist film 170 as a mask, (FIG. 15(a)). After that, the trench 162 is formed on the substrate 102 by plasma etching of the substrate 102 using the resist film 170 as a mask (FIG. 15(b)). Subsequently, in a procedure similar to that described in the first embodiment, a semiconductor device having the configuration as illustrated in FIGS. 13(a), 13(b), and 13(c) can be obtained.

In this embodiment, the lower corner of the trench on the drain side can be covered with the second offset region 107 and the PN boundary line 130 can be located at a position distant from the lower corner of the trench on the drain side. Even if a voltage is applied to the gate electrode 122 upon operation of a transistor, electric field concentration to the lower corner of the trench can therefore be prevented. This makes it possible to greatly suppress generation of hot carriers, realize improvement of breakdown voltage, and enhance the long term reliability of the transistor.

Increasing the depth of the trench 162 leads to an increase in the channel width and improvement in the capacity of the transistor. When the depth of the trench 162 is increased and at the same time, the first offset region 106 and the second offset region 107 extended below the lower corners and the bottom of trench 162, the first offset region 106 and the second offset region 107 necessarily have an increased depth. In this embodiment, the depth of the first offset region 106 and the second offset region 107 in the areas where they will contact the trench 162 is greater than the depth of the first offset region 106 and the second offset region 107 in the areas where they will contact the device isolation insulating film 110. Even if the depth of the trench 162 is increased with a consequent increase in the depth of the first offset region 106 and the second offset region 107 in the areas that will contact trench 162, the depth of the first offset region 106 and the second offset region 107 in the areas where they will contact the device isolation insulating film 110 can still be kept shallower than the device isolation insulating film 110 in those areas. As a result, it is possible to improve the transistor power while keeping the device isolation ability.

Another embodiment of the method for making a semiconductor device 100 illustrated in FIGS. 13(a), 13(b), and 13(c) will be described.

FIGS. 18(a), 18(b), 19(a), and 19(b) are sectional views illustrating steps of a procedure for manufacturing the semiconductor device 100 in this example. This method differs from that described previously mainly in that the first offset region 106 and the second offset region 107 are formed after forming trench 162.

First, a device isolation insulating film 110 is formed on a substrate 102 in the same way as the procedure described with reference to FIG. 3(a) in the first embodiment. Then, without forming the first offset region 106 and the second offset region 107 in this stage, a well 104 is formed in the same way as described above. Subsequently, a thermally-oxidized film 160 is formed on one surface of the substrate 102, and on top of this thermally-oxidized film 160 there is formed a resist film 170 in which an opening 172 for forming a trench 162 is formed. After that, the substrate 102 is exposed within the opening 172 by removing the thermally-oxidized film 160 by etching by use of the resist film 170 as a mask (FIG. 18(a)).

Figure 18A:
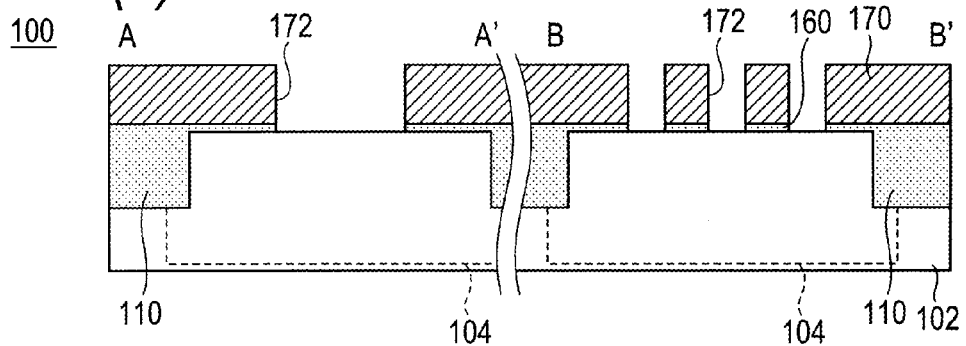
FIGS. 18(*a*) and 18(*b*) are sectional views illustrating another example of process for manufacturing the semiconductor device illustrated in FIGS. 13(*a*), 13(*b*), and 13(*c*)
Figure 18B:
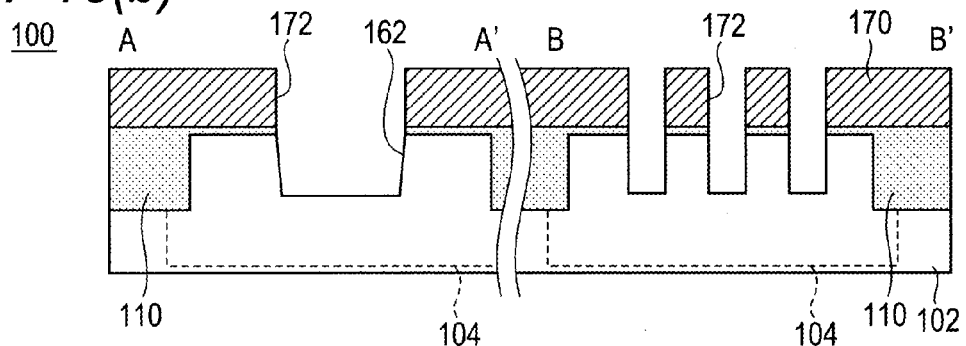

Subsequently, the trench 162 is formed on the substrate 102 by plasma etching of the substrate 102 using the resist film 170 as a mask (FIG. 18(b)). After that, the resist film 170 is removed.

Figure 20:
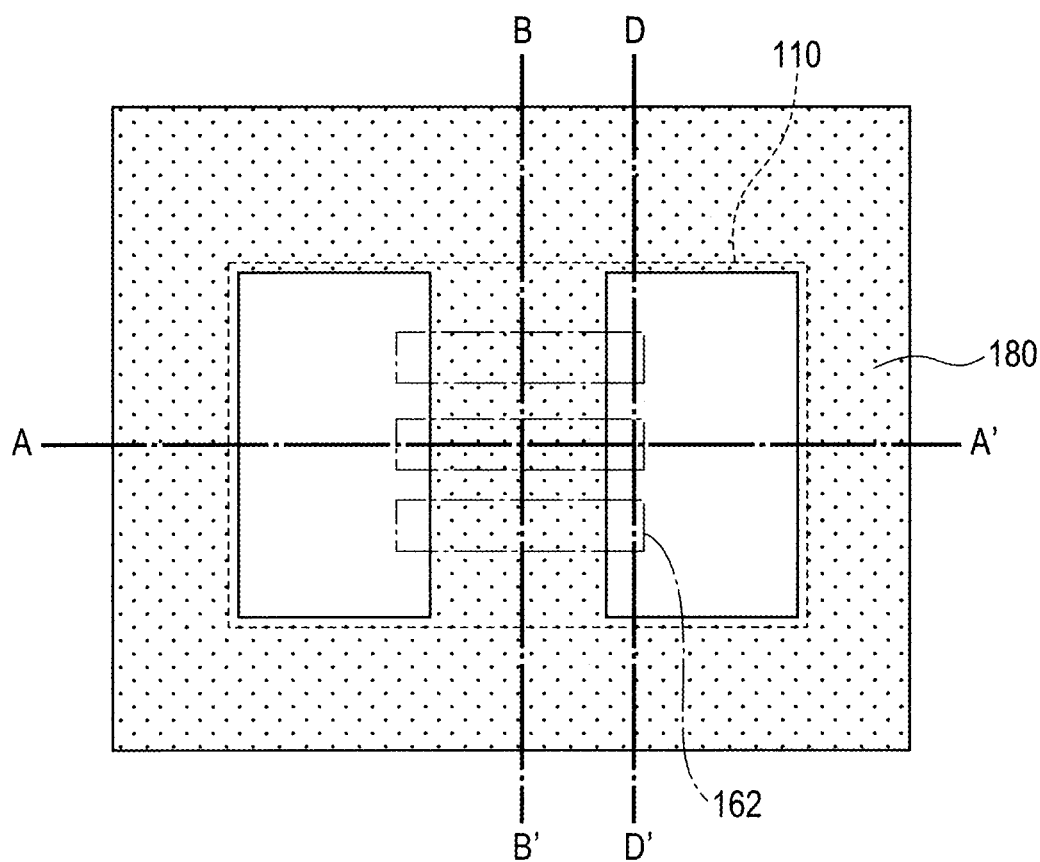
FIG. 20 is a plan view illustrating another example of a stage during the procedure for manufacturing the semiconductor device illustrated in FIGS. 13(*a*), 13(*b*), and 13(*c*)

A resist film 180 with openings corresponding to the intended locations of the first offset region 106 and the second offset region 107 is formed on one surface of the substrate 102. FIG. 20 is a plan view illustrating the state at this stage. The openings of the resist film 180 can be made similar to the resist film 157 described in the first embodiment, the distance x of each of the first offset region 106 and the second offset region 107 illustrated in FIG. 10 be a desired value.

Figure 19A:
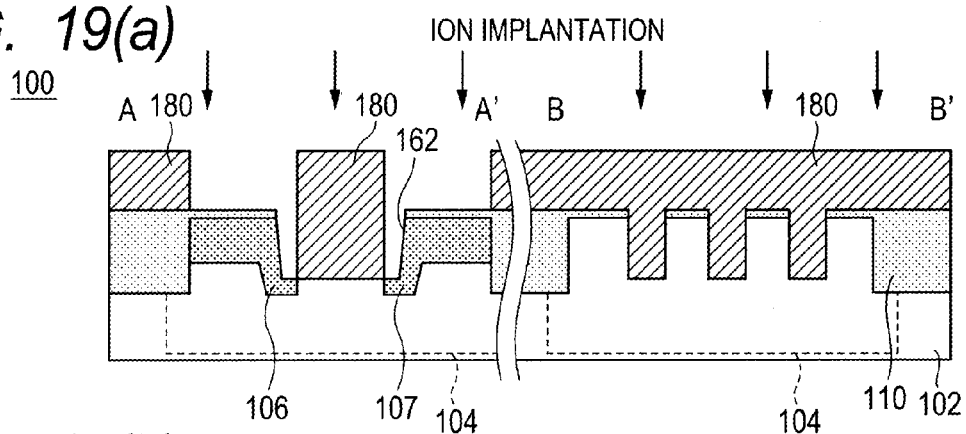
FIGS. 19(*a*) and 19(*b*) are sectional views illustrating another example of process for manufacturing the semiconductor device illustrated in FIGS. 13(*a*), 13(*b*), and 13(*c*)
Figure 19B:
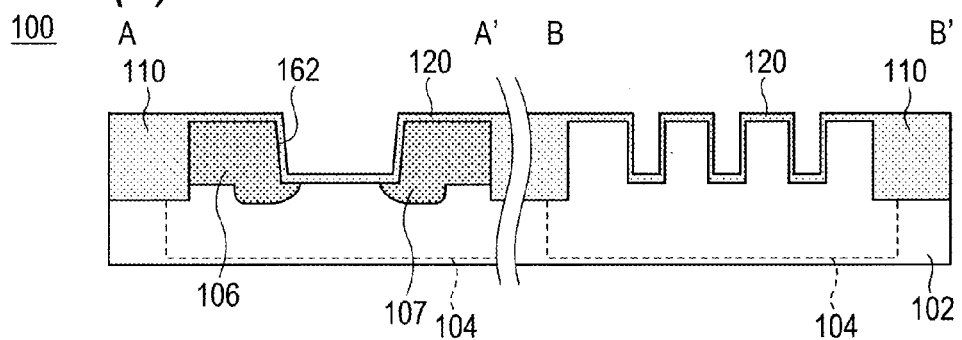
Figure 21A:
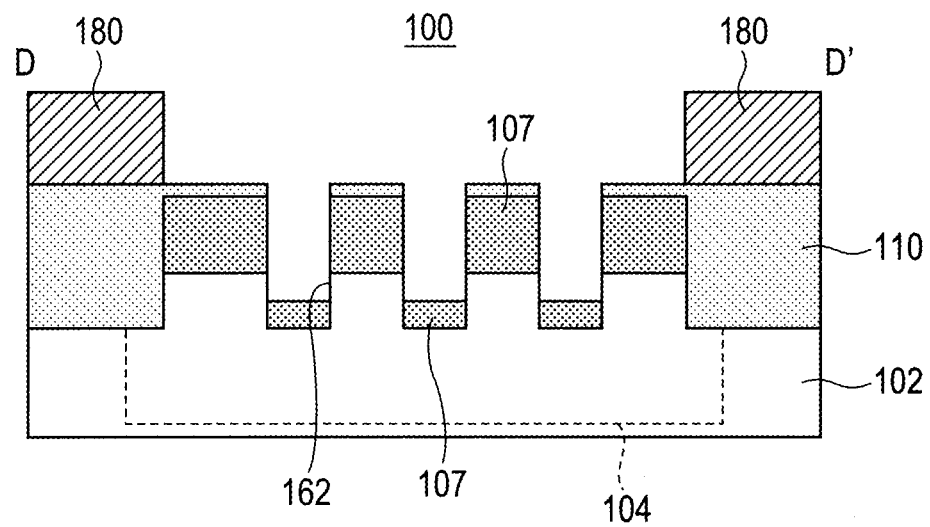
FIGS. 21(*a*) and 21(*b*) are sectional views illustrating a further example of a stage during a procedure for manufacturing the semiconductor device illustrated in FIGS. 13(*a*), 13(*b*), and 13(*c*)

Subsequently, using the resist film 180 as a mask, the first offset region 106 and the second offset region 107 are formed on the exposed surface of the substrate 102 by ion implantation of dopant ions of an n-type (first conductivity type) such as phosphorus ions (FIG. 19(a)). The ion implantation may be carried out in a vertical direction. In addition, the ion implantation may be performed under such a condition that the distance y of each of the first offset region 106 and the second offset region 107 illustrated in FIG. 10 be a desired value. Both the first offset region 106 and the second offset region 107 can be formed by single ion implantation, in this embodiment. FIG. 21(a) is a D-D' sectional view of FIG. 20 after ion implantation. Subsequently, the resist film 180 is removed.

Figure 21B:
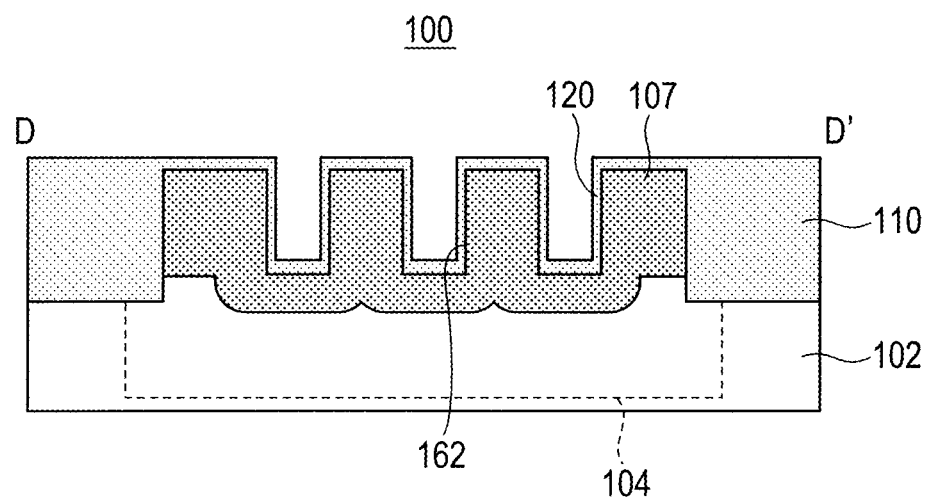
Figure 22:
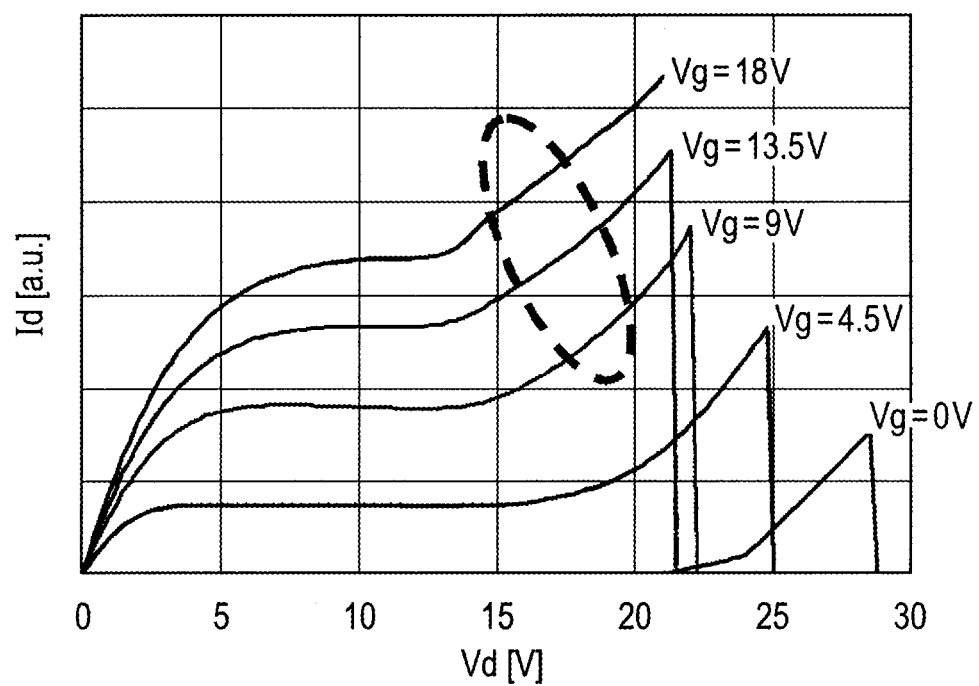
FIG. 22 is a graph showing the Vd-Id characteristics of the semiconductor device.

The whole surface of the substrate 102 is then heat treated. The heat treatment may be performed to form a gate insulating film 120 on one surface of the substrate 102 or to form a thermally-oxidized film different from the gate insulating film 120. It is also possible to perform heat treatment not for forming a thermally-oxidized film but for carrying out heat treatment in a nitrogen atmosphere. When a thermally-oxidized film different from the gate insulating film 120 is formed, removal of the thermally-oxidized film may be followed by the formation of the gate insulating film 120. By such a heat treatment, the dopant ions are diffused and as illustrated in FIG. 21(b), the second offset region 107 is formed below the trench 162, in a D-D' sectional view of FIG. 20. Similarly, in the first offset region 106 on the side of the source region 112, the first offset region 106 is formed below the trench 162 (FIG. 19(b)). The shape of the openings of the resist film 180 and the ion implantation condition can be determined in consideration of the diffusion amount of the dopant. This makes it possible to provide a dopant distribution condition which can be regarded uniform, in the gate width direction, in the device operation.

The embodiments of the present invention were described above with reference to the drawings. However, these embodiments are illustrative of the present invention and it is possible to adopt various configurations other than those described above. Also, a method of realizing the present invention is disclosed below.

(Additions)

[Addition 1]

A method of making a semiconductor device comprising:
forming a device isolation region on a substrate;
implanting, into the substrate, dopant ions of a first conductivity type for forming a first region and a second region, both of which are of the first conductivity type,
forming a channel region by implanting dopant ions of a second conductivity type between the first region and the second region;
forming a mask for forming a gate region in the channel region;
forming a trench in the substrate by use of the mask;
forming a gate electrode in the trench formed in the substrate; and
forming a source region and a drain region by implanting, into the vicinity of the surface of the substrate on the first region and the second region, dopant ions of the first conductivity type having a dopant concentration higher than that of the first region and the second region,
wherein the first region and the second region so that a sum of length measurements of the underlying portion of the second low-concentration region measured from the lower corner of the trench in a direction parallel to the substrate and in a direction perpendicular to the substrate is 0.1 μm or greater.

[Addition 2]

The method according to addition 1, wherein forming the trench comprises forming plural trenches in a gate width direction of the gate electrode.

[Addition 3]

The method of manufacturing a semiconductor device according to addition 1, wherein in the step of forming the first region and the second region, both of which are of the first conductivity type, the first low-concentration region and the second low-concentration region are formed symmetrical with respect to the gate electrode.

What is claimed is:

1. A semiconductor device comprising:
a substrate;
a source region and a drain region, both of which are of a first conductivity and arranged in the substrate;
a channel region of a second conductivity arranged, in the substrate, in a first direction between the source region and the drain region;
a first low-concentration region of the first conductivity formed in the substrate between the source region and the channel region and having a first conductivity dopant concentration lower than the first conductivity dopant concentration of the source region;
a second low-concentration region of the first conductivity formed in the substrate between the drain region and the channel region and having a first conductivity dopant concentration lower than the first conductivity dopant concentration of the drain region;
a trench formed in the substrate between the first low-concentration region and the second low-concentration region and having a side surface extending in the first direction between the first low-concentration region and the second low-concentration region, underlying a portion of a bottom of the trench including a lower corner portion thereof, the first and second low concentration regions both being in contact the bottom and sides of the trench;
a gate insulating film formed in the bottom and the side surface of the trench; and
a gate electrode formed in the trench through the gate insulating film such that the first direction of the gate electrode serves as a gate length direction,
wherein a depth direction, in the substrate, of the gate electrode serves as a gate width direction such that a portion of the channel region sideward, in a second direction crossing the first direction in a plane view of the substrate, from the side surface of the trench is arranged between the first low-concentration region and the second low-concentration region,
wherein a portion of the second low-concentration region extends under the bottom of the trench and extends beyond a width of the gate insulation film formed in the side surface of the trench so as to cover the lower corner portion such that a sum of length measurements of the underlying portion of the second low-concentration region measured from the lower corner portion of the trench in the first direction parallel to the substrate and in a depth direction perpendicular to the substrate is 0.1 μm or greater.

2. The semiconductor device according claim 1,
wherein a plurality of trenches are formed along the second direction such that a channel forming region is arranged the portion of the channel region, sideward in a second direction from the side surface of the trench, between trenches adjacent to the second direction.

3. The semiconductor device according to claim 1,
wherein the first low-concentration region and the second low-concentration region are bilaterally symmetrical with respect to the gate electrode.

4. The semiconductor device according to claim 1, wherein a PN boundary line between the second low-concentration region and the channel region is defined by forming the second low-concentration region by using ion implantation.

5. The semiconductor device according to claim 1,
wherein a PN boundary line between the first low-concentration region and the channel region is defined by forming the first low-concentration region by using ion implantation.

6. The semiconductor device according to claim 1,
wherein a ratio of the length measurement in the depth direction to the length measurement in the first direction is in a range of from 1:3 to 3:1.

7. The semiconductor device according to claim 1, wherein a ratio of the length measurement in the depth direction to the length measurement in the first direction is in a range of from 1:3 to 3:1.

8. The semiconductor device according to claim 1, wherein the sum of length measurements of 0.1 μm or greater is an inflection point to keep low the maximum electric field intensity in the drain region.

9. A semiconductor device comprising:
a substrate;
a source region and a drain region, both of which are of a first conductivity and arranged in the substrate;
a channel region of a second conductivity arranged, in the substrate, in a first direction between the source region and the drain region;
a first low-concentration region of the first conductivity formed in the substrate between the source region and the channel region and having a first conductivity dopant concentration lower than the first conductivity dopant concentration of the source region;
a second low-concentration region of the first conductivity formed in the substrate between the drain region and the channel region and having a first conductivity dopant concentration lower than the first conductivity dopant concentration of the drain region;

a trench formed in the substrate between the first low-concentration region and the second low-concentration region and having a side surface extending in the first direction between the first low-concentration region and the second low-concentration region, underlying a portion of a bottom of the trench including a lower corner portion thereof, the first and second low concentration regions both being in contact the bottom and sides of the trench;

a gate insulating film formed in the trench; and a gate electrode formed in the trench through the gate insulating film such that the first direction of the gate electrode serves as a gate length direction, wherein a depth direction, in the substrate, of the gate electrode serves as a gate width direction such that a portion of the channel region sideward, in a second direction crossing the first direction in a plane view of the substrate, from the side surface of the trench is arranged between the first low-concentration region and the second low-concentration region, wherein underlying portion of the second low-concentration region is delimited from the channel region by a boundary surface that is offset from said lower corner portion of the trench to extend past a width of the gate insulating film formed at the sides of the trench and that extends along a curved path from a lower position beneath the lower corner portion to an upper position meeting the at least one section of the trench at a location offset from the lower corner portion toward a middle of the channel region along the gate length direction, wherein the boundary surface is offset from the lower corner portion by a distance y is a direction perpendicular to a main surface of the substrate and extending further into said substrate from a device side of the substrate, and by a distance x is a direction parallel to a main surface of said substrate and extending toward a center of the channel region along a gate length thereof, wherein a sum of x and y is at least 0.1 μm.

10. The semiconductor device according to claim 9, wherein the boundary surface is an isoconcentration surface of dopant ions of the second conductivity at a concentration at which the dopant ions and dopant ions of the first conductivity in the channel region at said boundary surface substantially counteract one another.

11. The semiconductor device according to claim 9, wherein a sum of x and y is at least 0.5 μm.

12. The semiconductor device according to claim 9, wherein a ratio of y to x is in a range of from 1:3 to 3:1.

13. The semiconductor device according to claim 9, wherein the sum of length measurements of 0.1 μm or greater is an inflection point to keep low the maximum electric field intensity in the drain region.

14. A semiconductor device comprising:

a first semiconductor region of a first conductivity formed in a substrate and serving as a source region;

a second semiconductor region of the first conductivity formed in the substrate and serving as a drain region;

a channel region of a second conductivity arranged, in the substrate, in a first direction between the first semiconductor region and the second semiconductor region;

a trench formed in the substrate between a first low-concentration region and a second low-concentration region and having a side surface extending in the first direction between the first low-concentration region and the second low-concentration region, underlying a portion of a bottom of the trench including a lower corner portion thereof, the first and second low concentration regions both being in contact the bottom and sides of the trench;

a gate insulating film formed in the bottom and sides of the trench; and a gate electrode formed in the trench through the gate insulating film such that the first direction of the gate electrode serves as a gate length direction, wherein a depth direction, in the substrate, of the gate electrode serves as a gate width direction such that a portion of the channel region sideward, in a second direction crossing the first direction in a plane view of the substrate, from the side surface of the trench is arranged between the first low-concentration region and the second low-concentration region, wherein a portion of the second low-concentration region extends under the bottom of the trench and extends beyond a width of the gate insulation film formed in the sides of the trench so as to cover the lower corner portion such that a sum of length measurements of the underlying portion of the second low-concentration region measured from the lower corner portion of the trench in the first direction parallel to the substrate and in a depth direction perpendicular to the substrate is 0.1 μm or greater.

15. The semiconductor device according to claim 14, wherein a plurality of trenches are formed along the second direction such that a channel forming region is arranged the portion of the channel region, sideward in a second direction from the side surface of the trench, between trenches adjacent to the second direction.

16. The semiconductor device according to claim 14, wherein the first low-concentration region and the second low-concentration region are bilaterally symmetrical with respect to the gate electrode.

17. The semiconductor device according to claim 14, wherein a PN boundary line is formed between the second low-concentration region and the channel region.

18. The semiconductor device according to claim 14, wherein a PN boundary line is formed between the first low-concentration region and the channel region.

19. The semiconductor device according to claim 14, wherein the sum of length measurements of 0.1 μm or greater is an inflection point to keep low the maximum electric field intensity in the drain region.

* * * * *